US012224211B2

United States Patent
Ji et al.

(10) Patent No.: US 12,224,211 B2
(45) Date of Patent: Feb. 11, 2025

(54) MANUFACTURING METHOD OF SEMICONDUCTOR DEVICE USING GATE-THROUGH IMPLANTATION

(71) Applicant: SK keyfoundry Inc., Cheongju-si (KR)

(72) Inventors: Hee Hwan Ji, Daejeon (KR); Ji Man Kim, Cheongju-si (KR); Song Hwa Hong, Cheongju-si (KR); Bo Seok Oh, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

(21) Appl. No.: 17/747,121

(22) Filed: May 18, 2022

(65) Prior Publication Data
US 2022/0277960 A1  Sep. 1, 2022

Related U.S. Application Data

(62) Division of application No. 16/892,748, filed on Jun. 4, 2020, now Pat. No. 11,373,872.

(30) Foreign Application Priority Data

Feb. 27, 2020  (KR) .......................  10-2020-0024000

(51) Int. Cl.
*H01L 29/78*  (2006.01)
*H01L 21/265*  (2006.01)
(Continued)

(52) U.S. Cl.
CPC .. *H01L 21/823443* (2013.01); *H01L 21/2652* (2013.01); *H01L 21/266* (2013.01);
(Continued)

(58) Field of Classification Search
CPC ........... H01L 21/2652; H01L 21/26553; H01L 21/266; H01L 21/823412;
(Continued)

(56) References Cited

U.S. PATENT DOCUMENTS 6,011,290 A    1/2000  Gardner et al.
6,162,689 A   12/2000  Kepler et al.
(Continued)

FOREIGN PATENT DOCUMENTS

JP   2000-312002 A   11/2000
JP   2012-114209 A    6/2012
(Continued)

OTHER PUBLICATIONS

Machine English translation of KR-20060063299-A (Year: 2006).*

*Primary Examiner* — Yu Chen
(74) *Attorney, Agent, or Firm* — NSIP Law

(57) ABSTRACT

The present disclosure provides a method of manufacturing a semiconductor device includes forming a first gate insulating film on a substrate for a first device, forming a first gate electrode on the first gate insulating film; forming a mask pattern on the first gate electrode to expose opposing end portions of the first gate electrode, wherein a length of the mask pattern is smaller than a length of the first gate electrode; performing ion implantation through the exposed opposing end portions of the first gate electrode using the mask pattern to simultaneously form first and second drift regions in the substrate; forming spacers on sidewalls of the first gate electrode, respectively; and forming a first source region and a first drain region in the first and second drift regions, respectively.

18 Claims, 11 Drawing Sheets

(51) Int. Cl.
*H01L 21/266* (2006.01)
*H01L 21/8234* (2006.01)
*H01L 27/088* (2006.01)
*H01L 29/08* (2006.01)
*H01L 29/10* (2006.01)
*H01L 29/66* (2006.01)
*H01L 29/417* (2006.01)
*H01L 29/423* (2006.01)

(52) U.S. Cl.
CPC .............. *H01L 21/823412* (2013.01); *H01L 21/823418* (2013.01); *H01L 29/0886* (2013.01); *H01L 29/1045* (2013.01); *H01L 29/1095* (2013.01); *H01L 29/66598* (2013.01); *H01L 29/66659* (2013.01); *H01L 29/66689* (2013.01); *H01L 29/7835* (2013.01); *H01L 29/7836* (2013.01); *H01L 21/823462* (2013.01); *H01L 27/088* (2013.01); *H01L 29/41775* (2013.01); *H01L 29/42368* (2013.01); *H01L 29/665* (2013.01)

(58) Field of Classification Search
CPC ..... H01L 21/823418; H01L 21/823493; H01L 21/823462; H01L 29/66659; H01L 29/7835; H01L 29/66598; H01L 29/1045; H01L 29/1095; H01L 29/42368; H01L 21/76829; H01L 21/76832; H01L 21/76837

See application file for complete search history.

(56) References Cited

U.S. PATENT DOCUMENTS

| | | | |
|---|---|---|---|
| 8,698,236 | B2 | 4/2014 | Takeda et al. |
| 2007/0221999 | A1 | 9/2007 | Wu et al. |
| 2011/0108917 | A1 | 5/2011 | Shima |
| 2012/0126324 | A1 | 5/2012 | Takeda et al. |
| 2013/0026565 | A1 | 1/2013 | Verma et al. |
| 2013/0237027 | A1 | 9/2013 | Oh |
| 2015/0129959 | A1 | 5/2015 | Ji et al. |
| 2015/0137233 | A1 | 5/2015 | Xue et al. |
| 2015/0187938 | A1 | 7/2015 | Tang et al. |
| 2015/0364598 | A1 | 12/2015 | June et al. |
| 2017/0062554 | A1 | 3/2017 | Tan et al. |
| 2017/0186856 | A1 | 6/2017 | Han |
| 2017/0243950 | A1 | 8/2017 | Liu et al. |
| 2017/0263762 | A1 | 9/2017 | Hebert et al. |
| 2018/0013421 | A1 | 1/2018 | Park et al. |
| 2018/0096897 | A1 | 4/2018 | Shin et al. |
| 2018/0166567 | A1 | 6/2018 | Uhlig et al. |
| 2019/0019866 | A1 | 1/2019 | Kim et al. |
| 2020/0105927 | A1 | 4/2020 | Xu |
| 2020/0312666 | A1 | 10/2020 | Kim |
| 2020/0343145 | A1 | 10/2020 | Kang et al. |

FOREIGN PATENT DOCUMENTS

| | | | |
|---|---|---|---|
| KR | 20060063299 A | * | 6/2006 |
| KR | 10-1780147 B1 | | 9/2017 |

* cited by examiner

MANUFACTURING METHOD OF SEMICONDUCTOR DEVICE USING GATE-THROUGH IMPLANTATION

CROSS-REFERENCE TO RELATED APPLICATIONS

This application a division of U.S. patent application Ser. No. 16/892,748 filed on Jun. 4, 2020, which claims the benefit under 35 U.S.C. 119(a) of Korean Patent Application No. 10-2020-0024000 filed on Feb. 27, 2020, in the Korean Intellectual Property Office, the entire disclosure of which is incorporated herein by reference for all purposes.

BACKGROUND

1. Field

The present disclosure relates to manufacturing a semiconductor device using a gate-through ion (GTI) implantation method, more particularly, a formation of a drift region using ion implantation through the gate into the substrate.

2. Description of Related Art

A high voltage (hereinafter referred to as HV) semiconductor device refers to a device operating at a high voltage. Examples of typical HV devices are double-diffused drain metal oxide semiconductors (DDMOS), lateral diffused metal oxide semiconductors (LDMOS), and extended-diffused metal oxide semiconductors (EDMOS). HV devices are widely used in fields such as power supplies, power management, display driver IC, communications, automotive electronics, and industrial control. Among them, a display driver IC or chip refers to a chip for controlling a screen liquid crystal, and such a chip includes various block configurations, including a high voltage device. However, about 70% of the display driving chip area is formed of a high voltage (HV) device. Therefore, the size of the unit high voltage device is desirable.

A high voltage (HV) semiconductor device, compared to a low voltage (LV) semiconductor device, is designed to have an increased thickness of a gate insulating film to satisfy the breakdown voltage of the device, and to have a low concentration drift region having a large area to withstand the high voltage. As a result, the size of the display driving chip including the high voltage semiconductor device is increased.

Because the display driving chip is manufactured including a high voltage semiconductor device having a larger size than the low voltage semiconductor device, there is a limit in reducing the overall chip size.

The display driving chip is required to be implemented in a smaller size according to the specification because the competitiveness depends on the size. In order to reduce the size of the semiconductor chip, it is necessary to reduce the area of the HV device that occupies the largest chip area.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a semiconductor device includes forming a first gate insulating film on a substrate for a first device, forming a first gate electrode on the first gate insulating film; forming a mask pattern on the first gate electrode to expose opposing end portions of the first gate electrode, wherein a length of the mask pattern is smaller than a length of the first gate electrode; performing ion implantation through the exposed opposing end portions of the first gate electrode using the mask pattern to simultaneously form first and second drift regions in the substrate; forming spacers on sidewalls of the first gate electrode, respectively; and forming a first source region and a first drain region in the first and second drift regions, respectively.

The first drift region may include a first shallow drift region and a second deep drift region. The second drift region may include a second shallow drift region and a second deep drift region.

The method may further include forming a first silicide blocking layer between the first source region and the first gate electrode, forming a second silicide blocking layer between the first drain region and the first gate electrode, forming a first silicide layer on the first source region, and forming a second silicide layer on the first drain region.

The method may further include forming a device isolation region between the first device and a second device, forming a second gate insulating film on the substrate for forming the second device, forming a second gate electrode on the second gate insulating film, and forming a third drift region under the second gate electrode by performing the ion implantation through the second gate electrode, wherein the third drift region comprises a third shallow drift region and a third deep drift region.

The method may further include forming a body region in the substrate by performing another ion implantation through the second gate electrode. The body region may include a shallow body region and a deep body region, and forming a second source region and a second drain region in the body region and the third drift region, respectively.

The body region may have a depth greater than a depth of the device isolation region. The third drift region may have a depth less than a depth of the device isolation region.

The body region and the third drift region may be in contact with each other to form a PN junction region.

The method may further include forming a third silicide blocking layer between the second drain region and the second gate electrode, and forming a fourth silicide blocking layer between the second source region and the second gate electrode.

The first, second and third drift regions may have a same depth as each other with a respect to a top surface of the substrate.

The ion implantation may use a tilt and a rotation implantation method.

In another general aspect, a semiconductor device incudes: a first gate insulating film formed on the substrate, a first gate electrode formed on the first gate insulating film, first and second drift regions formed spaced apart from each other in the substrate, a first spacer respectively formed on sidewalls of the first gate electrode, and a first source region and a first drain region formed in the first and second drift regions, respectively, wherein each of the first and second drift regions include a shallow drift region and a deep drift region.

The device may further include: a second gate insulating film formed on the substrate, a second gate electrode formed on the second gate insulating film, a body region and a third drift region formed under the second gate electrode, and a second source region and a second drain region formed in the body region and the third drift region, respectively.

The third drift region may include a third shallow drift region and a third deep drift region.

The body region may include a shallow body region and a deep body region.

An inflection point may exist between the shallow drift region and the deep drift region.

The device may further include a device isolation region formed in a substrate between the first gate insulating film and the second gate insulating film.

In another general aspect, a method of manufacturing a semiconductor device, includes forming deep well regions in a substrate; forming gate insulating films on the deep well regions, respectively; forming gate electrodes on the gate insulating films, respectively; forming mask patterns on the gate electrodes, respectively, to expose opposing end portions of each of the gate electrodes, wherein a length of each of the mask patterns is smaller than a length of a corresponding gate electrode; performing ion implantation through the exposed opposing end portions of the gate electrodes using the mask patterns to simultaneously form drift regions in the substrate for each of the gate electrodes; forming spacers on sidewalls of each of the gate electrodes; and forming a source region and a drain region in each of the drift regions.

The device may, further include device isolation regions formed in the substrate between the deep well regions.

Each of the drift region may include a shallow drift region and a deep drift region.

The method may further include: forming a first silicide blocking layer between the source region and the gate electrode of each drift region; forming a second silicide blocking layer between the drain region and the gate electrode of each drift region; forming a first silicide layer on the source region of each drift region; and forming a second silicide layer on the drain region of each drift region.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
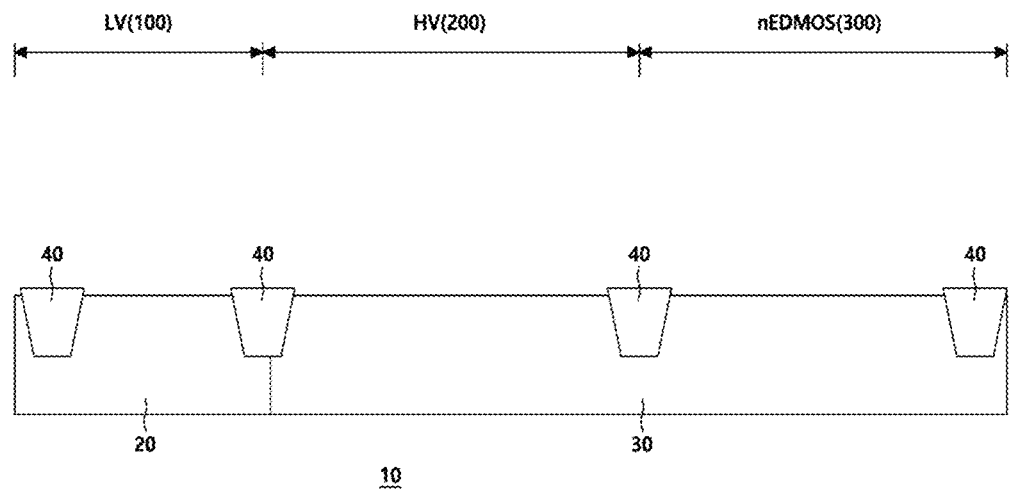
FIGS. 1A to 1H are cross-sectional views illustrating the manufacturing process of a semiconductor device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure is a method of manufacturing an HV device 200 in which a gate edge region is formed as a shallow junction. Hereinafter, the present disclosure will be described in more detail with reference to examples illustrated in the drawings.

The following description provides a method of manufacturing a semiconductor device of which the depth of the drift region formed under the edge region of the gate electrode is formed shallower than the depth of the source and drain regions.

The following description also provides a method of manufacturing a semiconductor device for forming a drift region after forming a gate electrode.

The following description may reduce the area of the HV device 200 by forming as a shallow junction.

FIGS. 1A to 1H are cross-sectional views illustrating a manufacturing process of a semiconductor device according to an example. The example will be described with reference to a semiconductor device in which an LV device 100, an HV device 200, and an nEDMOS device 300 are formed together on the semiconductor substrate 10.

As illustrated in FIG. 1A, a first deep well region 20 and a second deep well region 30 are formed in a semiconductor substrate 10. The first deep well region 20 is a region in which an LV device 100 is formed, and the second deep well region 30 is a region in which an HV device 200 and an nEDMOS device 300 are formed. That is, the second deep well region 30 may be referred to as a high voltage device region. For example, although nEDMOS is illustrated in FIG. 1, an nLDMOS device may be formed. This is because all of them are high voltage devices as BCD devices. Therefore, in FIG. 1A, a low voltage device and a high voltage device are formed side by side, and may be isolated through an isolation region.

The first deep well region 20 and the second deep well region 30 may be formed by doping impurities of the same conductivity type or different conductivity types. In an example, the first deep well region 20 is HNW formed of N-type doping material, and the second deep well region 30 is HPW formed of a P-type doping material. The HPW region is formed relatively wider.

The device isolation region 40 having a predetermined depth is formed in the first deep well region 20 and the second deep well region 30. As illustrated in the drawing, the depths of the device isolation regions 40 are the same. The device isolation region 40 may use LOCOS, STI, MTI, DTI, and the like. In this example, STI is used as the device isolation region 40. The device isolation region 40 functions to partition an active region, which is a region where unit devices such as LV device 100, HV device 200, and nEDMOS device 300 are formed.

Figure 1B:
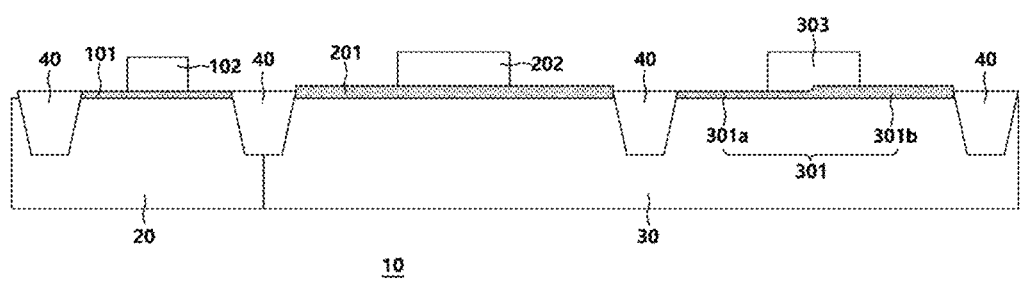

Gate insulating films 101, 201, 301, and gate electrodes 102, 202, 303 are formed on the first deep well region 20 and the second deep well region 30 by performing a gate patterning process as illustrated at FIG. 1B. The thicknesses of the gate insulating films 101, 201, and 301 are formed to be different from those of the LV device 100 and the HV device, and the thickness of the first gate insulating film 101 of the LV device 100 is formed to be smaller than that of the second gate insulating film 201 of the HV device. That is, because the HV device 200 operates at a higher voltage than the LV device 100, the thickness of the second gate insulating film 201 of the HV device 200 is greater than that of the first gate insulating film 101 of the LV device.

The gate insulating film 301 of the nEDMOS device 300 is formed of gate insulating films having different thicknesses. As the below process describes, a relatively thin gate insulating film (third gate insulating film 301a) and a thick gate insulating film (fourth gate insulating film 301b) are formed on the well region or the drift region. The reason why the thin gate insulating film (third gate insulating film 301a) is required is to increase the drain current (Idsat) value of the nEDMOS device. More current may flow due to lowering a threshold voltage (Vt) by using the thin gate insulating film. The reason why the thick gate insulating film (fourth gate insulating film 301b) is required is that the thick gate insulating film (fourth gate insulating film 301b) is not broken by the high voltage applied to the drain region. Thus, insulating films having different thicknesses are formed in the nEDMOS device.

The thickness of the first gate insulating film 101 may be the same as the thickness of the third gate insulating film 301a. And the thickness of the second gate insulating film 201 may be the same as the thickness of the fourth insulating film 301b. In such a case, the complexity of the process is reduced, and there are effects mentioned above. The current is increased by the thin gate insulating film, and the device reliability is improved by the thick gate insulating film.

Figure 1C:
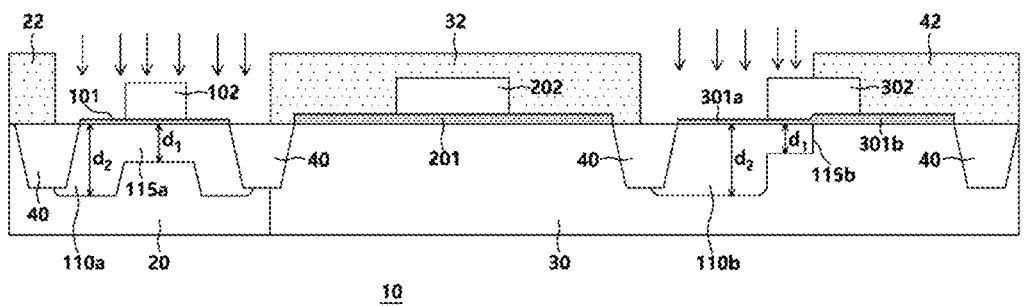
Figure 10:
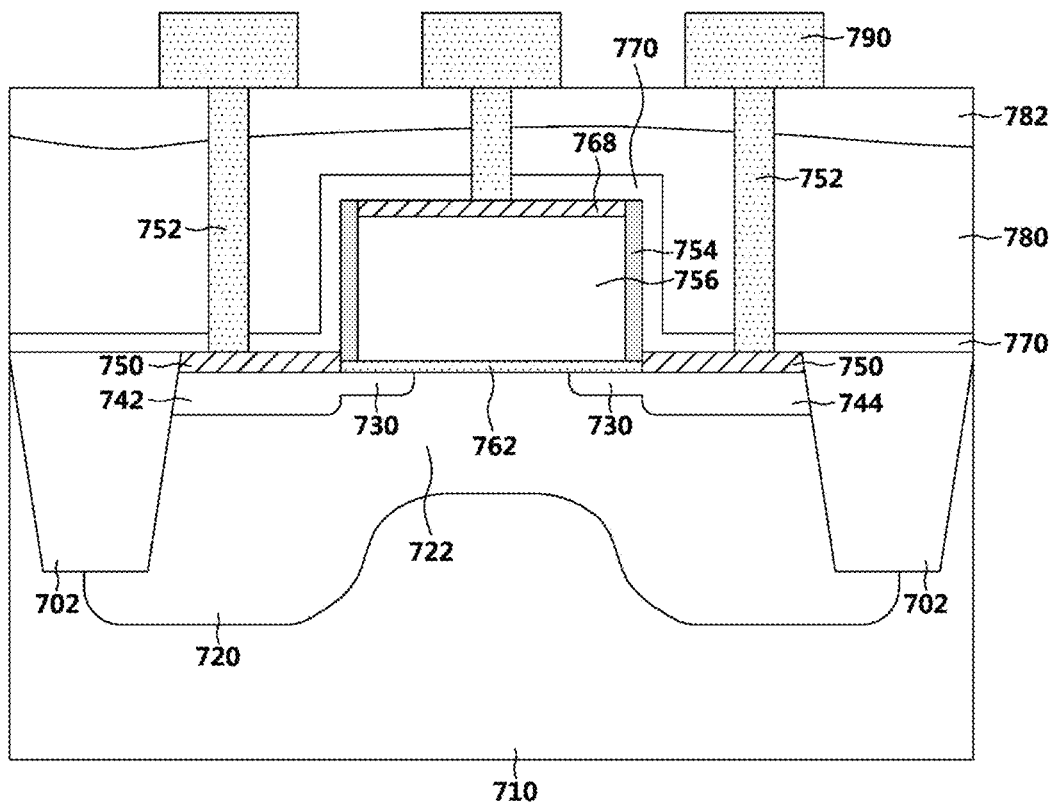
FIG. 10 is a cross-sectional view of a low voltage device manufactured according to an example.

FIG. 1C is a process of forming P-type well (PW) regions 110a for an LV device 100 and P-type body region 110b for an nEDMOS device 300. The PW regions 110a and P-type body region 110b are simultaneously formed by ion implanting P-type dopants into the upper surface of the substrate 10 using patterned photoresist masks 22, 32, and 42. In order to form the PW region 110a and P-type body region 110b in the LV device 100 and the nEDMOS device, the PR masks 22, 32, and 42 having a pattern, in which only portions where the PW region 110a and P-type body region 110b are to be formed are opened, are formed on the substrate. The dopant may be implanted into the substrate using the same ion implantation energy. In this way, the depths of the PW region 110a and P-type body region 110b formed in the LV device 100 and the nEDMOS device 300 are the same as each other. And during ion implantation, the gate electrodes 102 and 302 also serve as masks in addition to the PR masks 22, 32 and 42. Thus, as illustrated in FIG. 10, PW regions having different depths are formed. That is, a first depth d1 of the PW regions 115a and 115b under the gate electrode 120 is smaller than a second depth d2 of the regions 110a and 110b other than the gate electrodes. That is, because the gate electrodes 102 and 302 serve as masks during the ion implantation, the depth of the ion implantation may be reduced by the thickness of the gate electrodes 102 and 302. The second depth d2 between the gate electrodes 102 and 302 and the device isolation region 40 is different from the first depth d1 under the gate electrodes 102 and 302. The different thickness between the first depth d1 and the second depth d2 is caused by the gate insulating films 101 and 301 and the gate electrodes 102 and 302.

The P-type body region 110b of the nEDMOS device 300 serves as a body region. The P-type body region 110b is a region where a channel region is formed. The P type may be referred to as a first conductivity type, and the N type may be referred to as a second conductivity type. In addition, the photoresist masks 22, 32, and 42 may be removed through a plasma ashing and cleaning process.

Figure 1D:
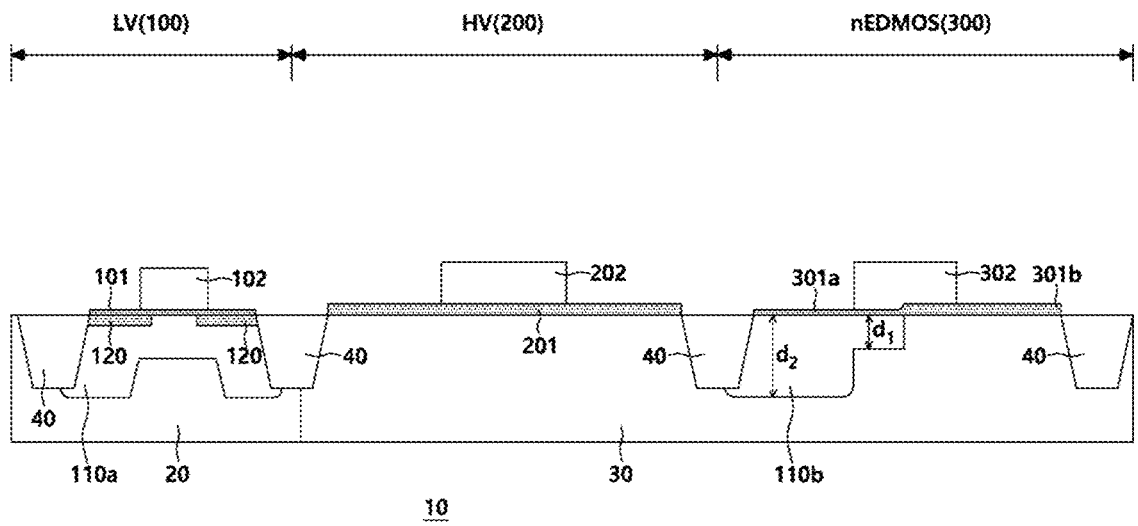

FIG. 1D illustrates that after removing the photoresist mask, an N-type LDD (Lightly Doped Drain) region 120 is formed in the P-type well region 110a of the LV device. The LDD region 120 is formed to have a predetermined thickness between the gate electrode 102 and the device isolation region 40, and serves to mitigate the electric field of the high concentration drain region. Therefore, it also reduces hot carrier injection (HCI) caused by a high electric field. The LDD region 120 is formed to a depth smaller than the thickness of the PW region 110a under the gate electrode 102 formed by the process of FIG. 10.

Figure 1E:
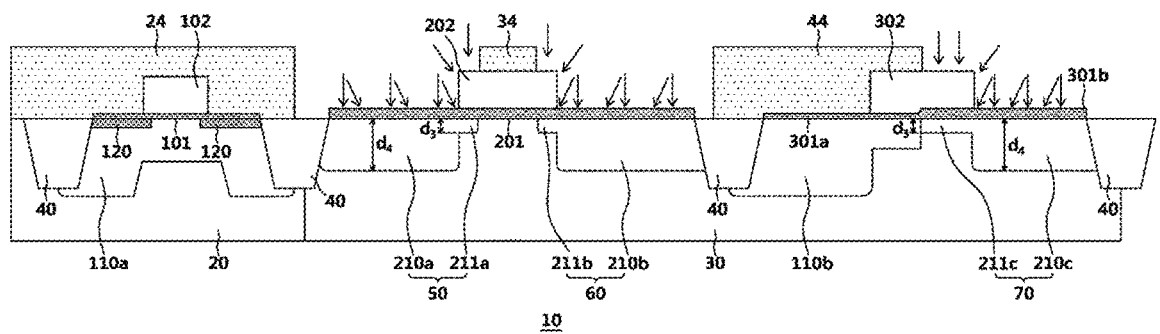

In order to form an N-type drift as illustrated in FIG. 1E, mask patterns 24, 34, and 44 are formed on the upper surface of the substrate 10 to cover the LV device 100, HV device 200, and nEDMOS device 300, respectively. The mask patterns 24, 34, and 44 are simultaneously formed on the substrate, and they are referred to as a drift mask pattern. The mask pattern 24 for LV device 100 covers the entire surface of the LV gate electrode 102 and the LV active regions 110a (LDD) and 120 (PW) so as not to implant dopants into the LV device 100. The mask pattern 44 for nEDMOS device 300 covers the P-type body region 110b and a first portion of the nEDMOS gate electrode 302. The mask pattern 44 for nEDMOS device 300 opens a second portion of the nEDMOS gate electrode 302 and a right portion of the active region to simultaneously form a shallow drift region 211a, 211b, 211c and a deep drift region 210a, 210b, 210c.

As shown in FIG. 1E, the mask pattern 34 is formed on the HV gate electrode 202. It is noted that the length of the mask pattern 34 is smaller than the length of the gate electrode 202. The mask pattern 34 for HV device 200 partially covers the HV gate electrode 202, and it opens both edge portion of the HV gate electrode 202, such that a center portion of the HV gate electrode 202 is blocked by the mask pattern 34. In such a state, ion implantations are performed to simultaneously form first and second shallow drift regions 211a and 211b as well as first and second deep drift regions 210a and 210b in the HV device 200. The shallow drift regions 211a, 21b are formed by the dopants penetrated through the HV gate electrode 202. On the other hand, the deep drift regions 210a, 210b are formed by the dopants directly implanted into the second deep well region 30. So the depths between the shallow drift region 211a, 211b, and the deep drift region 210a, 210b are different even though the same implantation energy is used.

Ion implantations in FIG. 1E may use the tilt and rotation implantation method, as well as the vertical implantation method, with respect to the top surface of the substrate to have more uniform dopants distribution in the shallow drift regions 211a, 211b, 211c. Both the first shallow drift region 211a and the first deep drift region 210a are merged to form a first drift region 50 in the HV device. In the same manner, both the second shallow drift region 211b and the second deep drift region 210b are merged to form a second drift region 60 in the HV device.

Further, a third shallow drift region 211c and a third deep drift regions 210c are also simultaneously formed in the nEDMOS device 300 by performing the ion implantations to form a third drift region 70. The first, second and third shallow drift regions 211a, 221b, 211c have the same depth (d3) with each other because they are formed in the same implantation conditions such as the same implantation energy and the same dopants concentration.

Herein, the shallow drift region 211a, 211b, 211c, also refers to a shallow portion or first portion of the drift region 50. The deep drift region 210a, 210b, 210c, also refers to a deep portion or second portion of the drift region 50.

The third depth d3 of the first, second, and third shallow drift regions 211 depends on the thickness of the HV and nEDMOS gate electrodes 202 and 302 because the HV and nEDMOS gate electrodes 202 and 302 serves as another mask pattern. The first, second and third drift regions 210a, 210b, 210c have the same depth (d4) with each other because they are formed in the same implantation conditions.

Shallow depths of the first and second shallow drift regions 211a, 211b in the HV device 200 are caused by the HV gate electrodes 202 serving as a mask pattern. The first and second shallow drift regions 211a, 211b are formed to overlap with edges of the HV gate electrode 202, respectively, in the HV device 200. The third depth, d3 in HV device 200 are as shallow as LDD region 120 in the LV device 100. The first and second shallow drift regions 211 are shallow junctions. Due to these shallow junctions under the gate electrode, the punch-through characteristic of the HV device 200 is improved compared with the conventional drift region. Accordingly, the short channel effect of the device may be improved that the gate length may be further reduced. This may reduce the chip size of the device, enabling a shrink down of chip size.

Figure 1F:
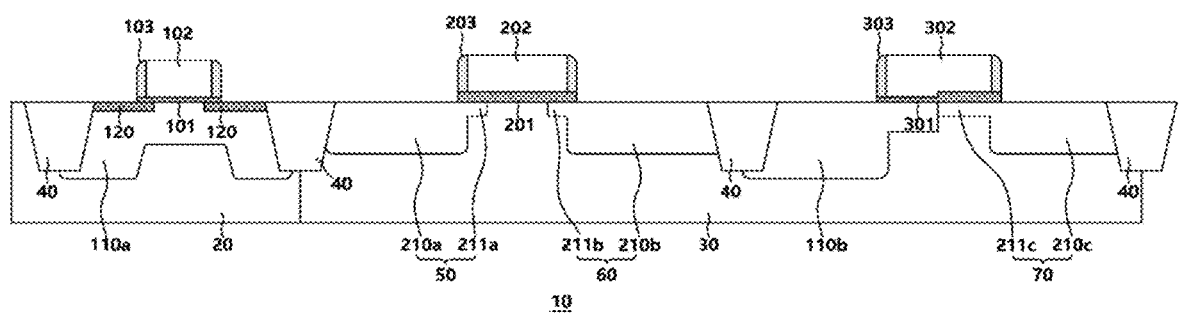

As shown in FIG. 1F, spacers 103, 203 and 303 are formed on sidewalls of the gate electrodes 102, 202, and 302, respectively, after the first, second, and third drift regions 50, 60 and 70 are formed.

Figure 1G:
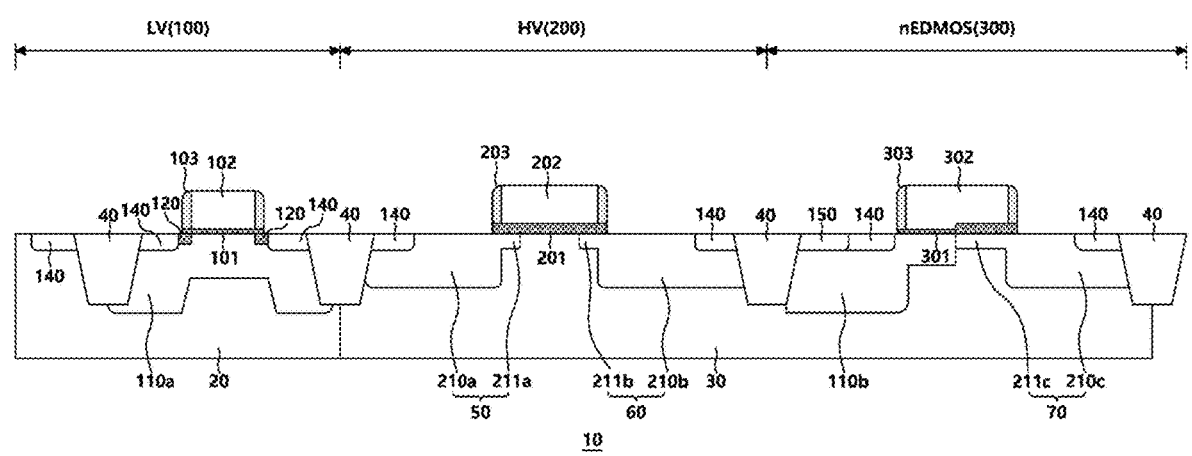

As illustrated in FIG. 1G, heavily doped regions N+ region 140 and P+ region 150 are formed. More specifically, the N+ region 140 is formed deeper than the LDD region 120 in the LDD region 120 of the P-type well region 110a of the LV device, and the N+ region 140 is disposed respectively between the gate electrodes 102, 202, and 302 and the device isolation region 40. In the nEDMOS device, the P+ region 150 and the N+ region 140 are formed in the P-type body region 110b. The N+ region 140 formed in the deep drift region 210 of the HV device 200 is in contact with the device isolation region 40 and is formed to be spaced apart from the gate electrodes 202 and 302 by a predetermined distance. As a distance between the N+ region 140 and the gate electrodes 202 and 302 increases, the breakdown voltage increases.

Figure 1H:
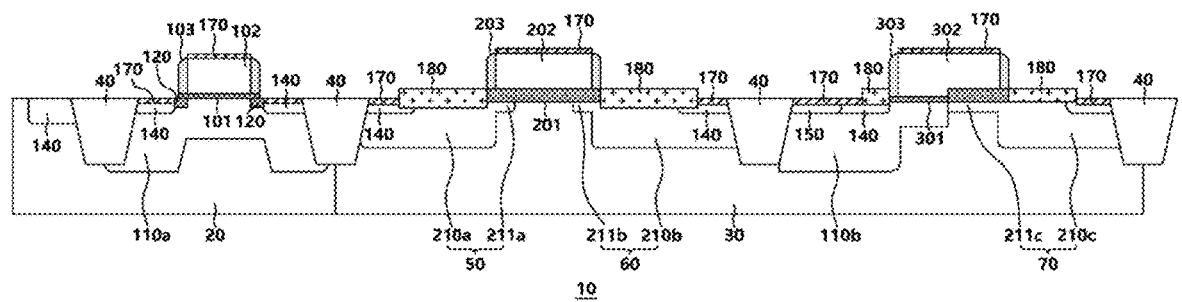

Silicide layers 170 and silicide blocking layers 180 are formed, as illustrated in FIG. 1H. The silicide layers 170 are formed over the N+ source/drain regions 140 and the gate electrodes 102, 202, 302, respectively. On the other hand, the first, second, and third silicide blocking layers 180 are formed over the first, second, and third drift regions 50, 60, 70, respectively. Further, the fourth silicide blocking layer 180 is also formed over the P-type body region 110$b$ to reduce the leakage current between the gate electrode 302 and the source region 140 in the nEDMOS device. The silicide blocking layers 180 block the formation of the silicide layer on a top surface of the substrate. The silicide blocking layers 180 are used to reduce the overall leakage current of the device, to increase the source-drain resistance, or to increase the breakdown voltage. The silicide layers 170 are formed by one of the materials selected from TiSi or CoSi2 or NiSi, etc. In this way, a semiconductor device with three devices is formed. Under the edge portion of the gate electrode, a shallow drift region is formed in the present example, and thus the chip size may be reduced by approximately 30% when compared with the typical process of forming the drift region before forming the gate electrode. As the chip size is reduced, many dies or chips may be secured in one wafer.

Figure 2A:
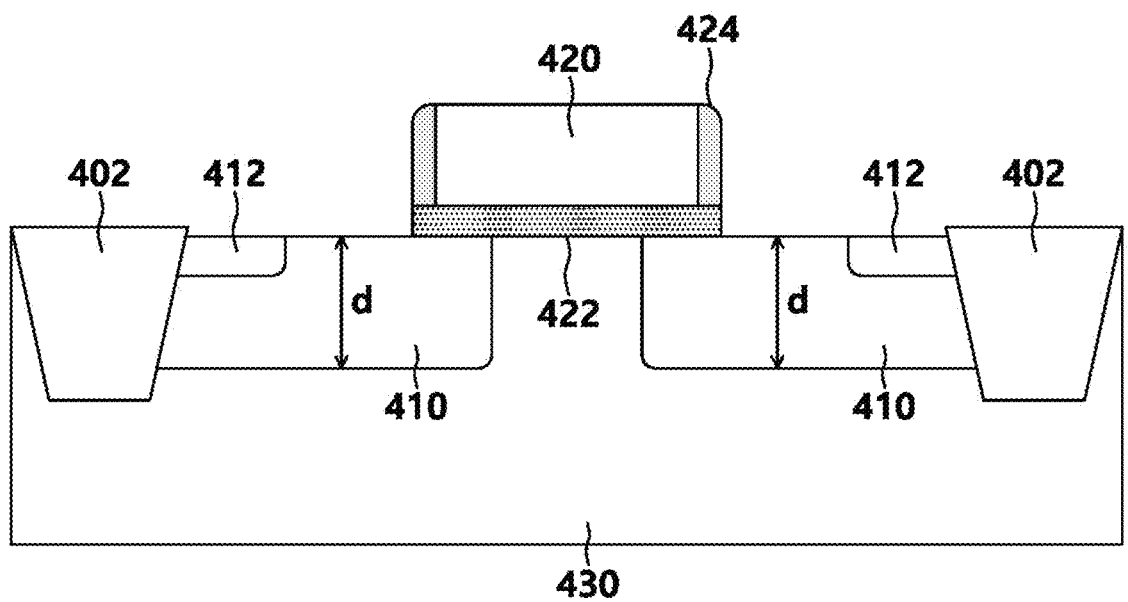
FIGS. 2A and 2B are cross-sectional views of each HV MOS device manufactured by split 1 and split 2 of an example.
Figure 2B:
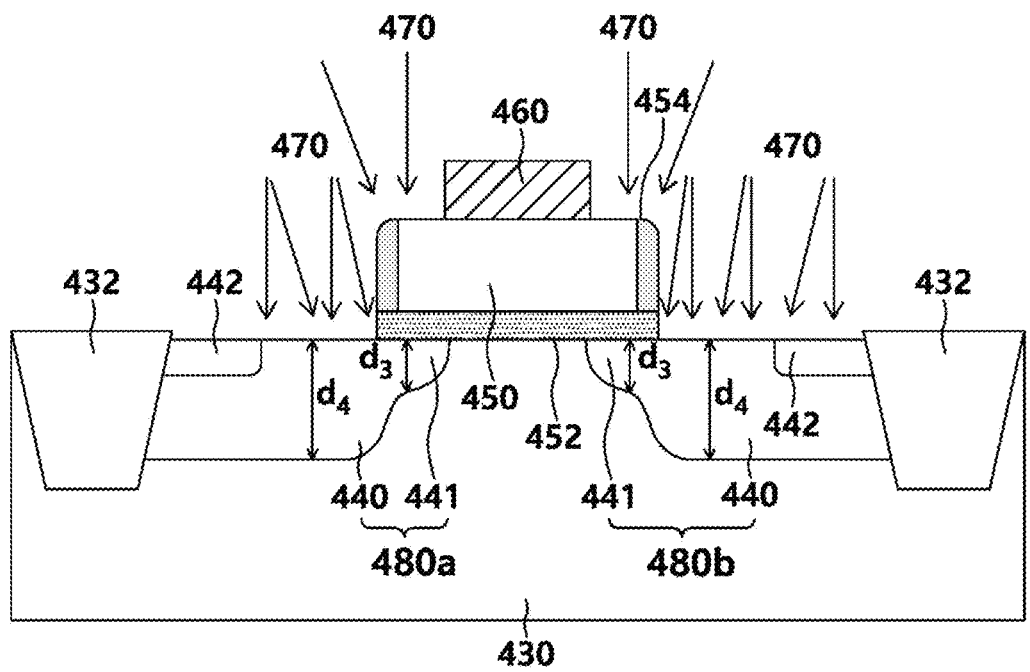

FIGS. 2A and 2B are cross-sectional views of high voltage device structures (HV MOSs) manufactured according to an example.

FIG. 2A is a cross-sectional view of a high voltage device manufactured by split 1 of the present disclosure. Split 1 refers to forming the drift region 410 before forming the gate electrode. Split 2 refers to forming a drift region (FIGS. 2B and 440) after the gate electrode. In other words, Split 2 refers to forming a gate-through implantation (GTI) method.

As illustrated in FIG. 2A, in the device formed by Split 1, a bottom surface of the drift region 410 is almost flat. Because ion implantation is performed to form the drift region 410 without the gate electrode 420 on the entire surface of the semiconductor substrate, the drift region 410 is formed to have the same constant bottom depth in the HPW region 430. The drift region 410 is formed before patterning the poly-Si layer, such that one drift junction laterally extends toward the other drift region. Thus, the two drift regions 410 are close to each other. Therefore, a short channel effect is increased in the device, and then a chip size shrink is difficult. For this reason, reducing an area of the HV device 200 is difficult. The depth of the drift region 410 is formed less than the depth of the device isolation region 402. The device isolation region 402 is formed to have a depth greater than that of the drift region 410 to be electrically isolated from another drift region (not illustrated) of a neighboring device.

After a gate electrode 420 is formed, a source region 412 and a drain region 412 are formed at a predetermined distance from the gate electrode 420 in order to increase the breakdown voltage.

On the other hand, FIG. 2$b$ is a cross-sectional view of the high voltage device manufactured by Split 2 of the present disclosure. After the gate electrode 450 is formed, the mask pattern 460 is formed on the HV gate electrode 450. It is noted that the length of the mask pattern 460 is smaller than a length of the gate electrode 450. Then, ion implantations 470 are performed while the drift mask pattern 460 covers a portion of the gate electrode 450. The drift mask pattern 460 is a photoresist material and exposes both side portions of the gate electrode 450. The drift mask pattern 460 blocks ion implantation 470 into a center portion of the gate electrode 450. So dopants 470 are implanted into the exposed gate electrode 450 and the active region 430 to form a shallow drift region 441 and a deep drift region 440 in the substrate 430. The shallow drift region 441 is formed by the dopants penetrated through the gate electrode 450. On the other hand, the deep drift region 440 is formed by the dopants directly implanted into the substrate 430. So the depths between the shallow drift region and the deep drift region are different even though the same implantation energy is used. Ion implantations in the FIG. 2B may use the tilt and rotation implantation method as well as the vertical implantation method with respect to the top surface of the substrate to have more uniform dopants distribution in the shallow drift regions 211$a$, 211$b$, 211$c$.

The deep drift region 440 and the shallow drift region 441 are merged to form a first drift region 480$a$ or a second drift region 480$b$. The two drift regions 480$a$, 480$b$ are symmetric structure with respect to an imaginary center line dividing the gate electrode 450. Due to the drift mask pattern 460, the drift region 480$a$, 480$b$ is not formed below the center portion of the gate electrode 450. A third depth d3 of the shallow drift region 441 is shallower than a fourth depth d4 of the deep drift region 440 because the gate electrode 450 plays a role of another implantation mask pattern. The depth difference between the d3 and the d4 depends on the thickness of the gate electrode 450 and the gate insulating layer 452. The shallow drift region 441 is in direct contact with the gate insulating film. The shallow drift region 441 has a depth greater than a depth of the source and the drain regions 442. Here, the source and the drain regions 442 are formed at a predetermined distance from the spacer 454 formed on sidewalls of the gate electrode, such that a high voltage device having an increased overall breakdown voltage is obtained. Although not illustrated, a silicide blocking insulating film (also referred to as a silicide blocking layer) may be formed between the source region 442 or the drain region 442 and the gate electrode 450. This increases the resistance between the gate electrode and the drain region (or source region), resulting in reducing the leakage current between the gate electrode and the drain region (or source region). A device isolation region 432 has a depth greater than that of the deep drift region 440 to be electrically isolated from another drift region (not illustrated) of a neighboring device.

Figure 3A:
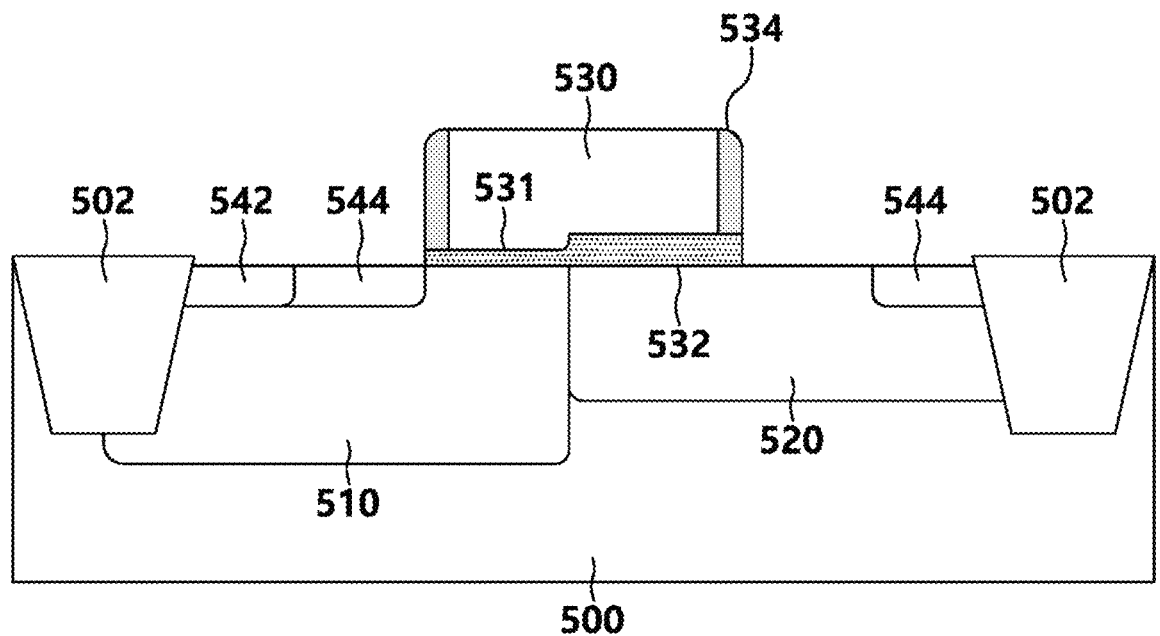
FIG. 3A is a cross-sectional view of an nEDMOS device 300 manufactured by split 1 of an example.
Figure 3B:
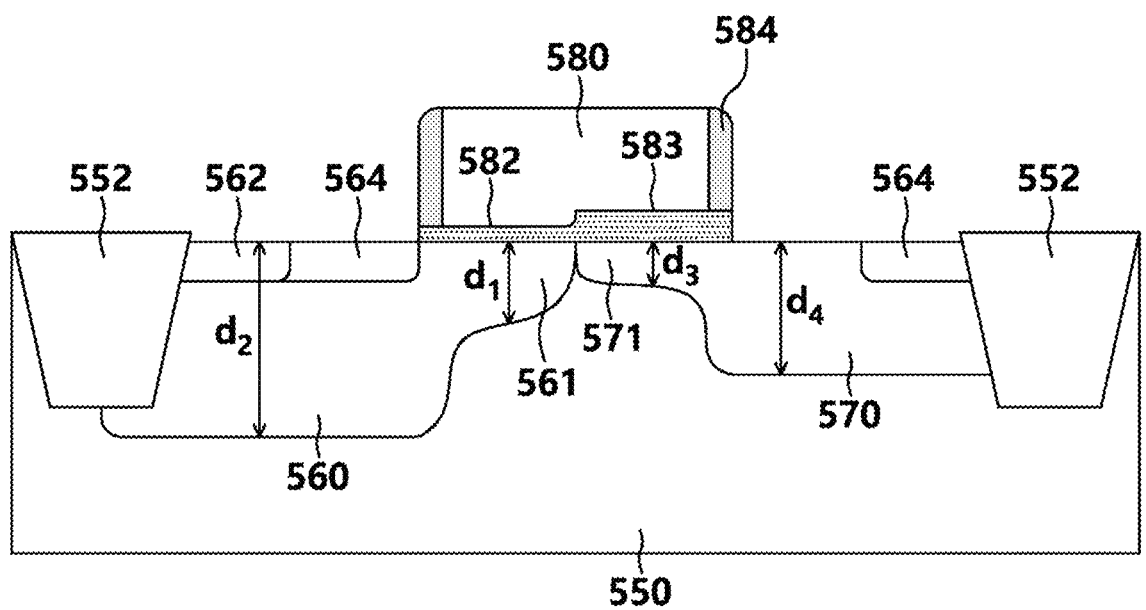
FIG. 3B is a cross-sectional view of an nEDMOS device 300 manufactured by split 2 of an example.

FIGS. 3A and 3B are cross-sectional views of high voltage device structures (nEDMOS) manufactured by the present disclosure.

FIG. 3A is a cross-sectional view of the nEDMOS device 300 manufactured by split 1 of the present disclosure. According to FIG. 3A, each bottom surface of the P-type well region 510 and the drift region 520 formed in the P-type HPW region 500 is almost flat. This structure may increase the short channel effect (SCE) of the device, making it difficult to shrink down.

In addition, a source region 544 and a drain region 544 are formed in the P-type well region 510 and the drift region 520, respectively. Pickup region 542 is formed in P-type well region 510. Thin and thick gate insulating films 531 and 532 are formed between the source region 544 and the drain region 544. The gate insulating film comprising thin and thick gate insulating films 531 and 532 has a different thickness. The thin gate insulating film 531 is formed near the source region 544, and the thick gate insulating film 532 is formed near the drain region 544. The thin gate insulating film 531 has an effect of lowering the threshold voltage, thereby increasing the source-drain current. The thick gate insulating film 532 is designed to withstand a high drain voltage, thereby increasing the breakdown voltage. The gate insulating films (FIGS. 3B, 582, and 583) illustrated in FIG. 3B, which are described afterward, also have the same effect. A gate electrode 530 is formed on the thin and thick gate insulating films 531, 532. A spacer 534 is formed on the sidewalls of the gate electrode.

FIG. 3B is a cross-sectional view of an nEDMOS device 300 manufactured by split 2 of the present disclosure. As illustrated, the P-type body region 560 has a different bottom depth. The P-type body region 560 between the gate electrode 580 and the device isolation region 552 has a first depth (d1) shallower than a second depth (d2) of P-type body region 560 under the gate electrode 580. The first depth, d1, is the depth of the shallow PW region 56 under the gate electrode 580. This is because ion implantation is performed using the gate electrode 580 as a mask. The first depth, d1, is a depth of the shallow PW region 561 under the gate electrode 580. The second depth, d2, is a depth of the P-type body region 560 outside the gate electrode 580. The shallow PW region 561 has a doping concentration less than a doping concentration of the P-type body region 560 because the gate electrode partially blocks the ion implantation into the shallow PW region. The PW region comprises the shallow PW region 561 and the P-type body region 560, wherein the shallow PW region 561 and the P-type body region 560 are simultaneously formed in one step at the same process condition.

An N-type drift region 570 also has a different bottom depth. The N-type drift region 570 between the gate electrode 580 and the device isolation region 552 has a third depth (d3) shallower than a fourth depth (d4) of N-type drift region 560 under the gate electrode 580. This is because ion implantation is performed using the gate electrode 580 as a mask. The third depth, d3, is a depth of the shallow drift region 571 under the gate electrode 580. The fourth depth, d4, is a depth of the deep drift region 570 outside the gate electrode 580. The shallow drift region 571 has a doping concentration less than a doping concentration of the deep drift region 570 because the gate electrode partially blocks the ion implantation into the shallow drift region. The drift region comprises the shallow drift region 571 and the deep drift region 570, wherein the shallow drift region 571 and the deep drift region 570 are simultaneously formed in one step at the same process condition.

As illustrated in FIG. 3b, it is formed thick in the order of d3<d1<d4<d2. A depth of the P-type body region 560 is formed deeper than a depth of the deep drift region 570, which is caused by a difference in ion implantation energy used for the PW region and the drift region. PW ion implantation energy for forming the PW region is greater than DRFIT ion implantation energy for forming the drift region. A channel region is formed. Here, even the shallow PW region 561 has a depth deeper than a depth of the source region 564, the drain region 564, or the body pickup region 562. The source region 564 is spaced apart from a high voltage PW region (HPW) 550 by the shallow PW region 561. So the source region 564 does not contact the high voltage PW region (HPW) 550. A threshold voltage of the nEDMOS device 300 depends on a doping concentration of the shallow PW region 561.

As illustrated in FIG. 3B, the shallow PW region 561 and the N-type shallow drift region 571 are formed under the thin gate insulating film 582 and the thick gate insulating film 583, respectively. The N-type shallow drift region 571 has a depth (d3) less than a depth (d1) of the shallow PW region 561. a PN junction region is formed under the gate insulating films 582 and 583 by abutting the N-type shallow drift region 571 with the shallow PW region 561. The N-type shallow drift region 571 serves to further extend or expand the drift region 570 to the channel region.

The deep drift region 570 and the N-type shallow drift region 571 have depths deeper than a depth of the drain region 564, the source region 564, or the body pickup region 562. The deep drift region 570 has a depth shallower than a depth of the isolation region 552, but the P-type body region 560 has a depth deeper than a depth of the isolation region 552.

As illustrated in FIG. 3B, the drain region 564 is formed spaced apart from the sidewall spacer 584, so as to form a high voltage device. The breakdown voltage varies depending on the distance between the drain region 564 and the gate electrode 580. On the other hand, the source region 564 is aligned with the spacer 584 formed on sidewalls of the gate electrode 580.

Figure 4A:
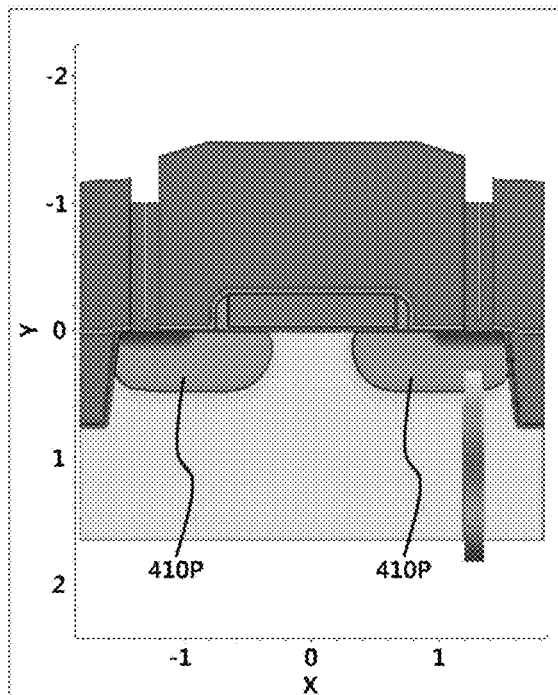
FIGS. 4A and 4B are the result of each device simulation for a HV NMOS device formed by split 1 and split 2 of an example.
Figure 4B:
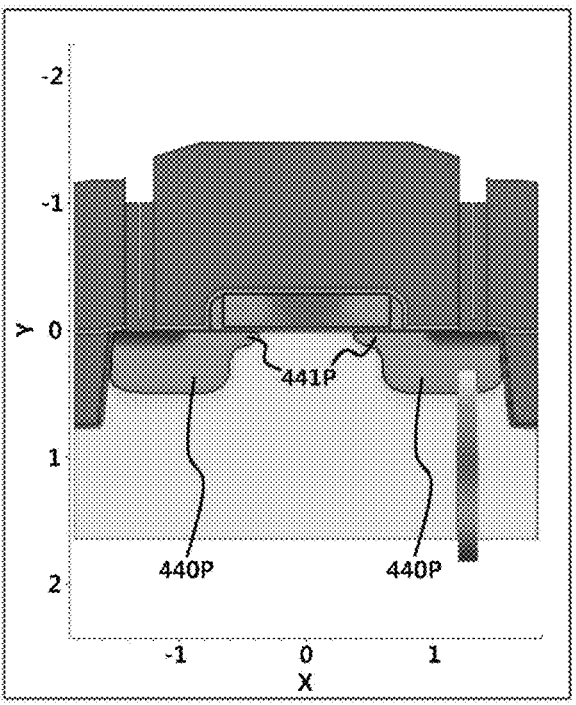

FIGS. 4(a) and 4(b) illustrate device simulation results of the respective device for the HV NMOS device formed by split 1 and split 2 of the present disclosure. As described above, a bottom surface of the N-drift region 440N and 441N by the split 2 (GPI method) of the present disclosure has a different profile from that of the N-drift region 410N by the split 1 of the present disclosure. Among them, the bottom surfaces under the gate electrode are very different from each other. As illustrated in FIG. 4(b), a shallow drift region exists under the gate electrode, and a deep drift region exists outside the gate electrode. The shallow drift region and the deep drift region each have a different slope. There are two gentle curves. This profile of the drift region is caused by the gate-thorough implantation method. In contrast, in FIG. 4(a), there is only one deep drift region. When formed as illustrated in FIG. 4B, the gate length of the HV device 200 may be further reduced. This is because a shallow drift region having lower doping concentration than the deep drift region exists under the gate electrode. Punch-through may be improved.

Figure 5A:
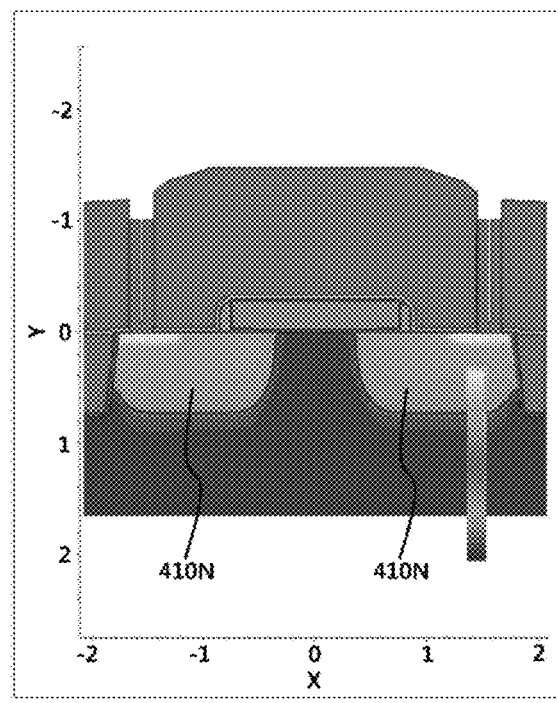
FIGS. 5A and 5B are the result of each device simulation for a HV PMOS device formed by split 1 and split 2 of an example.
Figure 5B:
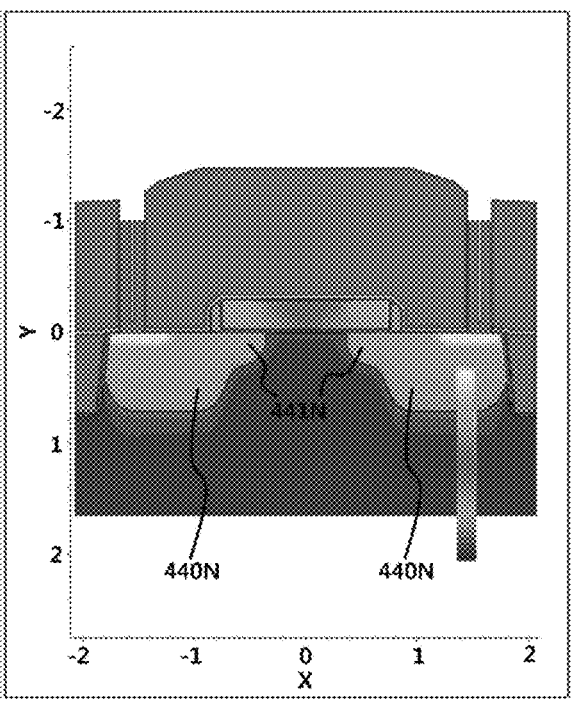

FIGS. 5(a) and 5(b) illustrate device simulation results of the respective device for the HV PMOS device formed by split 1 and split 2 of the present disclosure. The doping profiles of the P-drift region 410P by split 1 and the doping profiles of the P-drift region 440P and 441P by split 2 are different. Among them, the doping profiles under the gate electrode are very different from each other. The further description is omitted as it is already described in the description of FIGS. 4(a) and 4(b).

Figure 6:
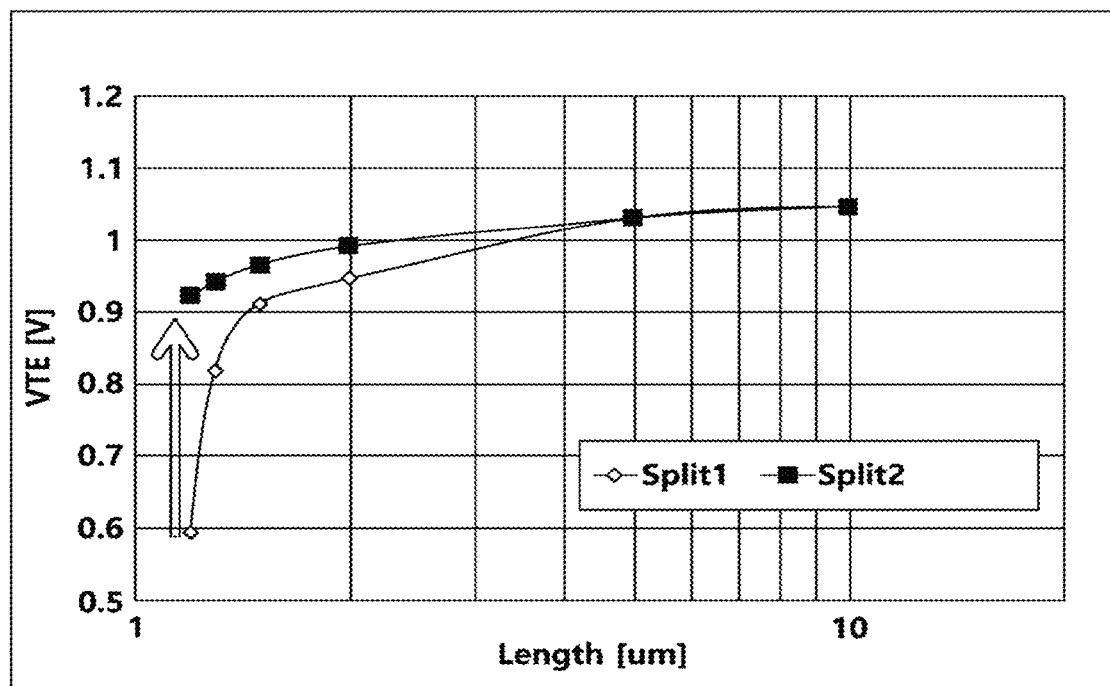
FIG. 6 is a performance graph of HV NMOS devices formed by split 1 and split 2 of an example.
Figure 7:
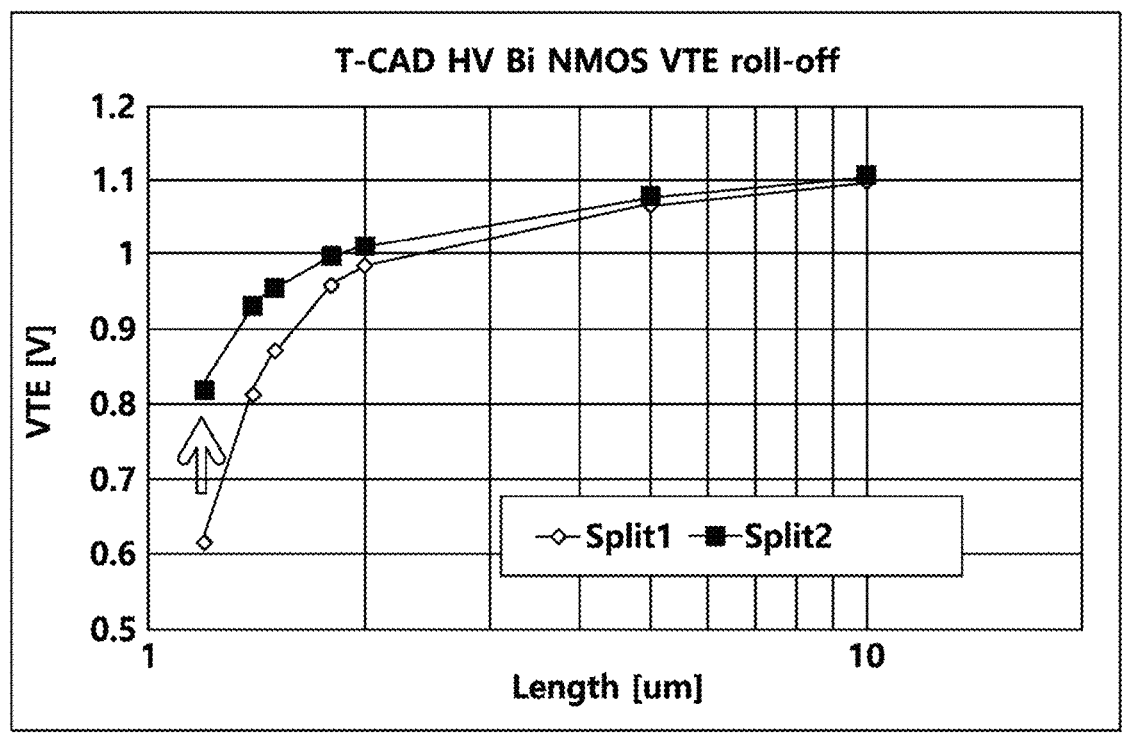
FIG. 7 is a performance graph of HV PMOS devices formed by split 1 and split 2 of an example.

FIG. 6 is an extrapolated Vt (VTE) roll-off graph of the HV NMOS device formed by split 1 and split 2 of the present disclosure. FIG. 7 is an extrapolated Vt (VTE) roll-off graph of the HV PMOS device formed by split 1 and split 2 of the present disclosure. The X-axis represents the gate electrode length or channel length. The Y-axis represents the threshold voltage value VTE. As illustrated, in the technique of the present disclosure (marked as SPLIT 1), the threshold voltage remarkably decreases as the length of the gate electrode decreases. This phenomenon (short channel effect) occurs because the channel length decreases as the gate electrode length decreases. However, in the present disclosure (marked as Split 2), as the gate electrode length or channel length becomes smaller, the threshold voltage (VTE) value decreases more slowly than the technology of the present disclosure (marked as Split 1). It can be seen that the short channel effect (SCE) is improved in both HV NMOS and HV PMOS by split 2 of the present disclosure.

As in the present example, by forming the junction of the gate edge region to a small depth by a gate-through implantation (GTI) method, which is a process of ion implantation using a patterned gate electrode as a mask, it can be seen that the short channel effect (SCE) and punch-through characteristics are improved, compared to a technology of forming drift before forming a gate electrode, thereby enabling shrink down of the device Next, each unit device structure of the semiconductor device illustrated in FIG. 1 is described.

Figure 8:
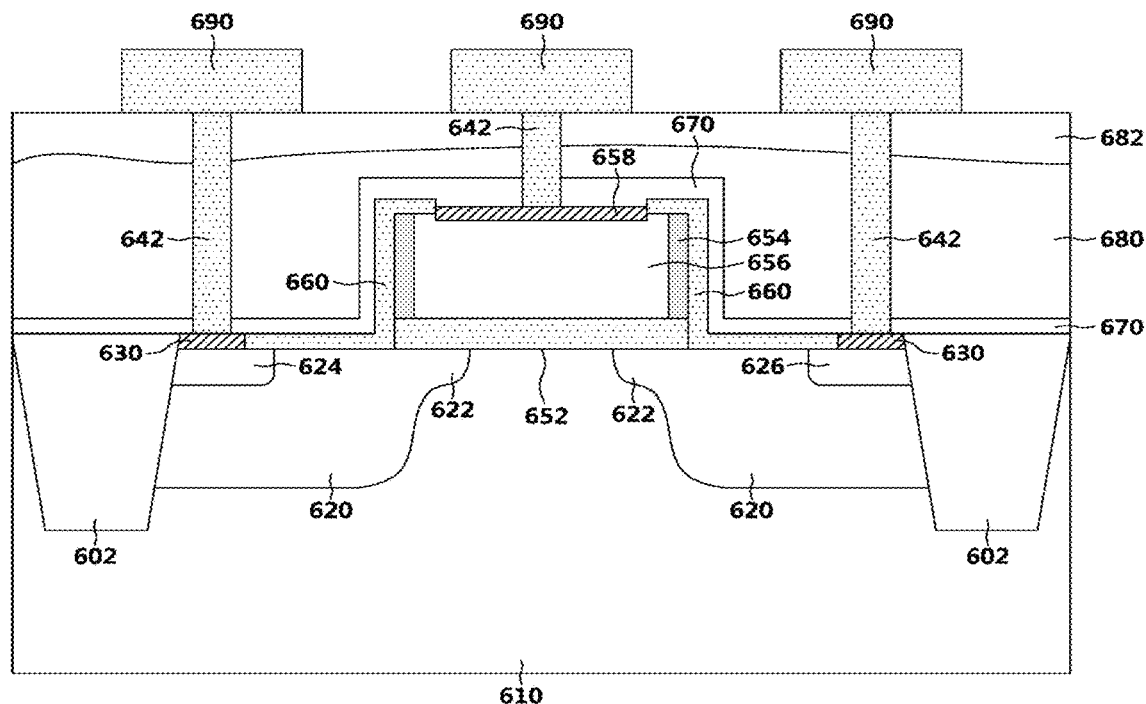
FIG. 8 is a cross-sectional view of an HV EDMOS device manufactured according to an example.

FIG. 8 is a cross-sectional view of the HV EDMOS device manufactured according to an example. As illustrated, HWP region 610 is formed in the substrate, and two device isolation regions 602 are formed at a predetermined depth on the surface of the substrate.

The two N-type drift regions 620 are formed symmetrically in the HPW region 610. Each N-type drift region 620 is formed to have different thicknesses, that is, the first portion under the gate electrode 622 becomes a shallow drift region 622 formed with a relatively small thickness, and the second portion between the gate electrode 656 and the device isolation region 602 is formed to be thicker. As described above, the first portion of the N-type drift region near the edge of the gate electrode helps to improve the short channel effect characteristic.

As illustrated in FIG. 8, one drift region as a whole is divided into two regions 620 and 622, and the side profile of the drift region is changed twice. Inflection points exist in the shallow and deep drift regions.

An N-type source region 624 and an N-type drain region 626 are formed in the pair of N-type drift 620 regions, respectively. The source region 624 and the drain region 626 are not aligned with the spacer 654 and are formed by ion implantation spaced apart to reduce leakage current from gate-source and gate-drain, respectively. The heavily doped source region 624 and the drain region 626 are formed in contact with the device isolation region 602. Each of the source region 624 and the drain region 626 has a depth shallower than a depth of the shallow drift region 622. In addition, silicide layers 630 and 658 are formed on the heavily doped regions 624 and 626, and the gate electrode 656. In addition, the source/drain contact plug 642 is formed by being connected to the source region 624 and the drain region 626, respectively.

As illustrated in FIG. 8, a gate insulating film 652, a gate electrode 656, and a spacer 654 are formed on the substrate. The spacer 654 insulating film is formed on the gate insulating film 652 as well as sidewalls of the gate electrode 656. Silicide layers 630 and 658 and a silicide blocking insulation layer 660 are formed on the gate electrode and on a top surface of the substrate. The silicide blocking insulation layer 660 serves to prevent silicide formation. In the example, the silicide blocking insulation layer 660 uses a SiO2 insulating film, but an insulating film such as SiN, SiON, or etc., may be used.

The silicide blocking insulation layer 660 is formed on both edge portions of the gate electrode 656. The silicide layer is formed on a center portion of the gate electrode 656. Thus, the heights of both ends of the gate electrode 656 are formed higher than the center thereof.

As illustrated in FIG. 8, a first insulating layer 670 for borderless contact (BLC) is formed with respect to the entire area of the substrate. The first insulating layer 670 is also formed on the gate electrode 656, silicide layers 630 and 658, the device isolation region 602, and the silicide blocking insulation layer 660. The first insulating layer 670 may be formed of silicon nitride film (SiN) or silicon oxynitride film (SiON). Second and third insulating layers 680, 682 are sequentially formed on the first insulating layer 670. The second insulating layer 680 comprises a borophosphosilicate glass (BPSG) or a phosphosilicate glass (PSG) material. The third insulating layer 682 comprises a silicon oxide formed by Tetraethyl orthosilicate (TEOS) material. A metal wiring layer 690 connected to the source/drain contact plug 642 is formed on the third insulating layer 682.

Figure 9:
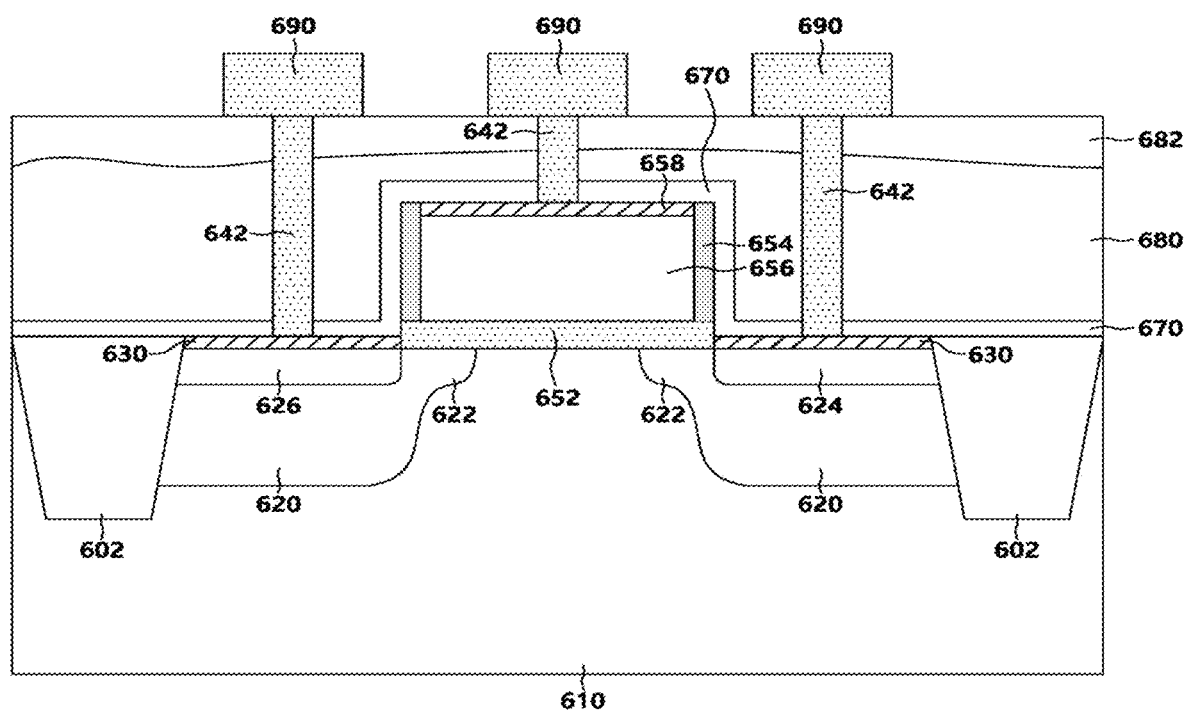
FIG. 9 is a cross-sectional view of a medium voltage (MV) DDMOS device manufactured according to an example.

FIG. 9 is a cross-sectional view of a medium voltage MOS (MV MOS) device manufactured according to an example.

FIG. 9 is almost similar to the cross-sectional view of the device of FIG. 8 described above; however, there is a difference in the alignment of an N-type heavily doped source and drain regions with respect to the gate electrode. As illustrated, two device isolation regions 602 are formed in an HPW region 610 and the surface of the substrate at a predetermined depth. N-type drift regions 620 and 622 are formed symmetrically in the two HPW regions 610, respectively. Each of N-type drift regions 620 and 622 has a shallow drift region 622 and a deep drift region 620. As such, a short channel effect of a device may be improved by forming the shallow drift region 622. A spacer 654 insulating film is also formed on the gate insulating film 652. An N-type source region 624 and a drain region 626 are formed in the two N-type drift regions 620, respectively, and may be formed to align with the spacer 654. Silicide layers 630 are formed on the source region 624 and the drain region 626. A gate silicide layer 658 is also formed on the entire surface of the gate electrode 656. Thus, in FIG. 9, the silicide blocking insulation layer is not required to be formed. In addition, contact plugs 642, a first insulating layer 670, a second insulating layer 680, a third insulating layer 682 are formed.

FIG. 10 is a cross-sectional view of a low voltage device manufactured according to an example. As illustrated, an N-type HNW region 710 is formed on the substrate, and PW regions 720 and 722 are formed thereon. In addition, a device isolation region 702 is formed at a predetermined depth from the substrate surface. The device isolation region 702 is formed over the HNW region 710 and the PW regions 720 and 722. One PW region 720 and 722 may be divided into a shallow depth PW region 722 and a deep depth PW region 720, which is caused by ion implantation through the gate electrode 756. After forming the PW regions, LDD regions 730 are formed in the PW regions 720 and 722 on both sides of the gate electrode 756. The spacer insulating film 754 is also formed on the gate insulating film 762. A high concentration source region 742 and a drain region 744 are formed in the PW regions 720 and 722. Silicide layers 750 are formed on the source and drain regions. Gate silicide layer 768 is formed on the entire surface of the gate electrode 756. Contact plugs 752 connected to the source region 742 and the drain region 744 are also formed. A first insulating layer 770, a second insulating layer 780, a third insulating layer 782, and a metal wiring layer 790 are also formed.

FIGS. 8, 9, and 10 are cross-sectional views of the high voltage, medium voltage, and low voltage devices, respectively. Although the gate length is illustrated similarly, the gate length is actually smaller in order of high voltage, medium voltage, and low voltage devices.

Figure 11:
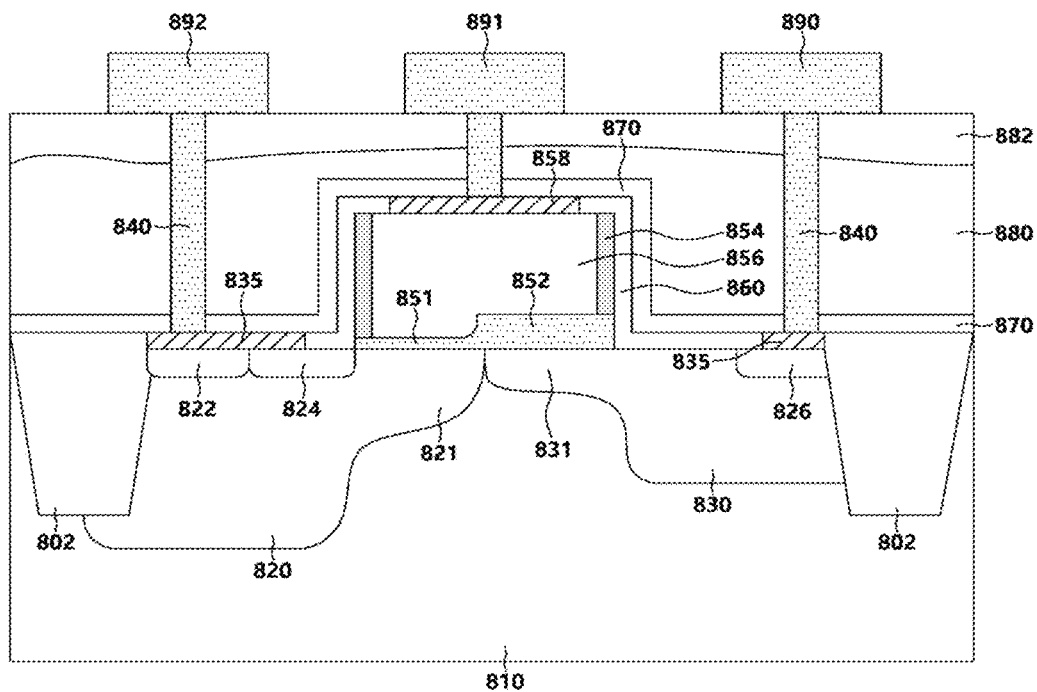
FIG. 11 is a cross-sectional view of an nEDMOS device manufactured according to an example.

FIG. 11 is a cross-sectional view of the nEDMOS device 300 manufactured according to an example. The pEDMOS device differs only in the conductivity type, and the structure thereof is the same, and thus details are omitted.

As illustrated in FIG. 11, a P-type HPW region 810 and a device isolation region 802 are formed on a substrate. In addition, a P-type deep body region 820 and an N drift region 830 are formed in the HPW region 810. As illustrated, the P-type deep body region 820 and the N drift region 830 are configured with a deep region and a shallow region. That is because the P-type deep body region 820 and the N drift region 830 are formed by ion implantation through the gate electrode 856.

As illustrated in FIG. 11, a deep body region 820 is formed deeper than the device isolation region 802. The deep body region 820 and the shallow body region 821 form one P-type body region. In addition, a bottom profile of the PW region has an inflection point between the deep body region 820 and the shallow body region 821.

A deep drift region 830 has a depth shallower than a depth of the device isolation region 802. A shallow drift region 831 has a depth shallower than a depth of the shallow body region 821. An inflection point also exists between the deep drift region 830 and the shallow drift region 831.

The P+ body contact region 822 and the N+ source region 824, which are heavily doped regions, are formed in the P-type deep body region 820. The N+ drain region 826 is formed in the N-type deep drift region 830. The N+ source region 824 is aligned with the spacer 854. The silicide layers 835 are formed on the P+ body contact region 822, the N+ source region 824, and the N+ drain region 826, respectively. The total length of the silicide layer 835 is less than a maximum horizontal length of the N+ source or drain regions 824 and 826. This is to reduce the substrate leakage current. A leakage current occurs between the substrate and the silicide layer, and when the silicide layer 835 extends beyond the source region or the drain region toward the direction of the gate electrode, the leakage current tends to increase by that amount. In order to reduce this, the silicide layer is formed so as not to cover the entire source or drain regions. That is, the silicide layer is formed only in a portion of the source or drain region. A silicide layer is also formed on the gate electrode.

Gate insulating films 851 and 852 are formed on the substrate. The spacer 854 is formed on the gate insulating films 851 and 852 as well as on sidewalls of the gate electrode. A silicide blocking insulation layer is formed on the entire surface of the substrate. The silicide blocking insulation layer 860 serves to prevent silicide formation. Thus, if the silicide blocking insulation layer 860 is not formed, silicide layers 835 and 858 are formed. In the example, the silicide blocking insulation layer 860 comprises one or stacked materials selected from a SiO2, SiN, SiON, etc. A first insulating layer 870 for borderless contact is formed on the silicide layers 835 and 858, the silicide blocking insulation layer 860, and the device isolation region 802. The first insulating layer 870 may be formed of silicon nitride film (SiN) or silicon oxynitride film (SiON). A second insulating layer 880, a third insulating layer 882, and a metal wiring layer 890 are also formed.

Figure 12:
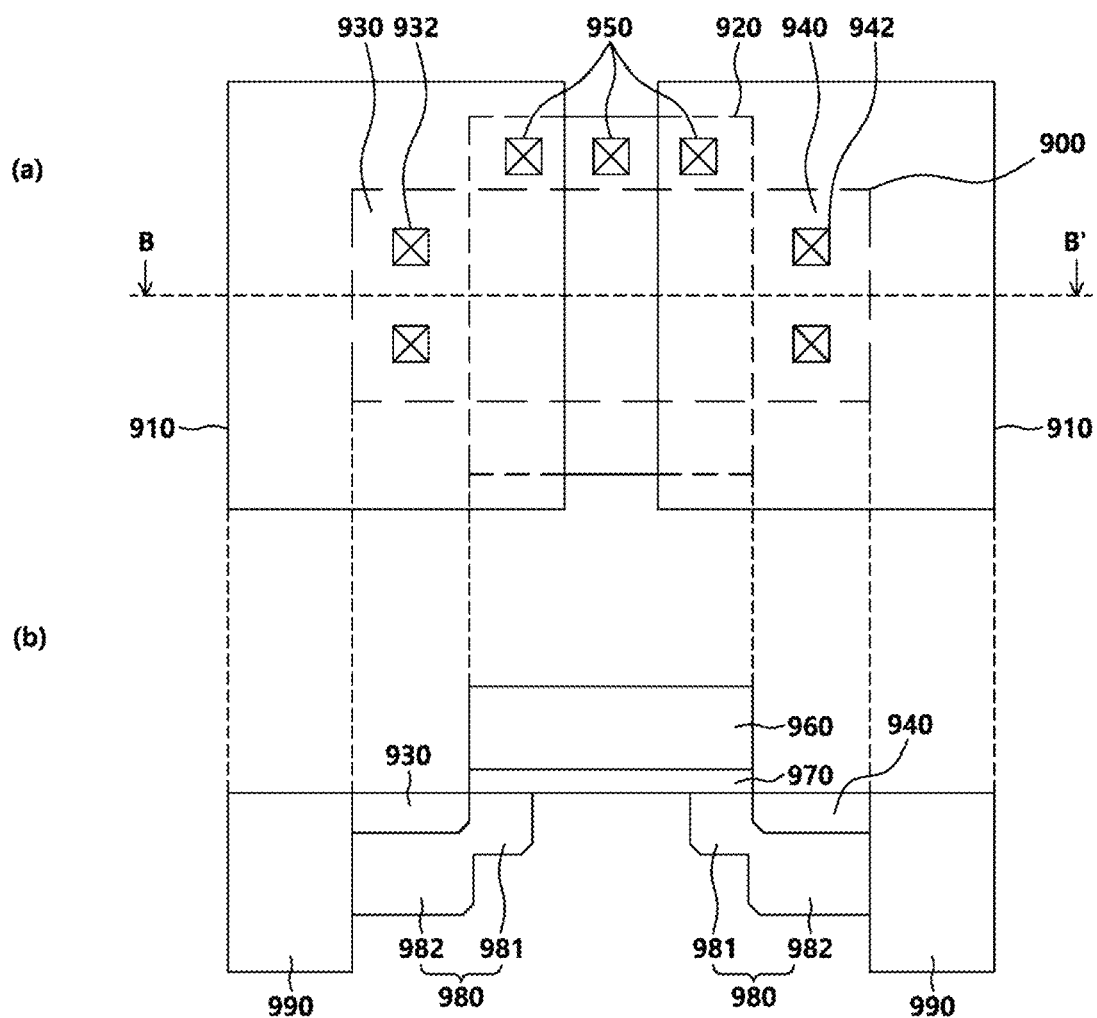
FIG. 12 is a cross-sectional view of a device of an HV device according to an example.

FIG. 12 is a device plan view of the HV device 200 according to an example of the present disclosure.

(a) of FIG. 12 illustrates an active region 900 for forming an active region, two drift regions 910, and a gate electrode 920.

The two drift regions 910 are formed to overlap the active region 900 and the gate electrode 920. The gate electrode 920 is partially overlapped with the two drift regions 910. In order to reduce the unit device size, the vertical size of the gate electrode 920 does not exceed the size of the drift region 910.

A source contact 932 is formed in the high concentration source region 930, and a drain contact 942 is formed in the high concentration drain region 940. Reference numeral 950 denotes a gate contact 950 connected to the gate electrode 920. The gate contact 950 is formed outside the active region 900.

(b) of FIG. 12 is a cross-sectional view taken along line B-B' of (a) of FIG. 12 and illustrates a cross-sectional view of a device formed later through the device plan view, as illustrated in (a) of FIG. 12. The source region 930 and the drain region 940 are formed in the active region, and the remaining regions are surrounded by the device isolation region 990. Because the drift region 980 is ion-implanted in a vertical direction deeper than the source and drain regions 930 and 940, the drift region 980 is formed surrounding the source and drain regions 930 and 940.

The ion implantation is performed in a state where a separate drift forming mask is positioned on the gate electrode in the state where the gate electrode 960 is patterned. Therefore, the shallow drift region 981 under the gate electrode is smaller than the depth of the drift region 982 formed outside the gate electrode. The shallow drift region 981 has a depth deeper than a depth of either a source region 930 or a drain region 980. The depth of the remaining drift region 982 is formed deeper than the shallow drift region 981.

Figure 13:
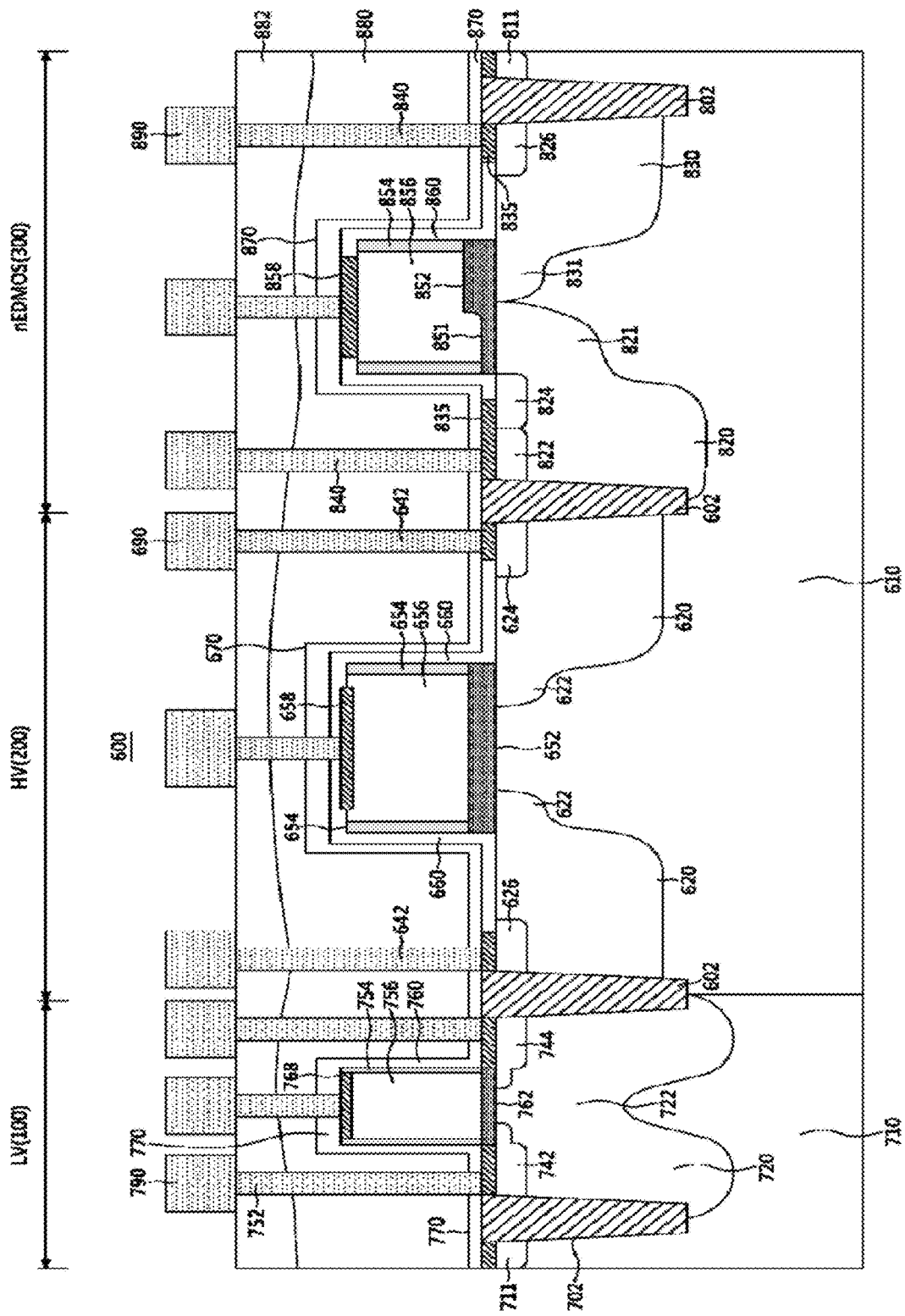
FIG. 13 is a cross-sectional view of an LV device, an HV device, and an nEDMOS device formed on one substrate according to an example.

FIG. 13 is a cross-sectional view of an LV device, an HV device, and an nEDMOS device 300, according to an example.

As illustrated in FIG. 13, the LV device 100, the HV device 200, and the nEDMOS device 300 are formed on one substrate 10. The LV device 100 is formed in an N-type deep well region, HNW 710. The HV device 200 and the nEDMOS device 300 are formed in the P-type deep well region, HPW 610. The LV device 100, the HV device 200, and the nEDMOS device 300 may be regarded as first, second, and third transistors formed on a substrate, respectively. N+ heavily doped region 711 is formed in the HNW 710 to allow a ground voltage or other voltage to be applied to the HNW 710. P+ heavily doped region 811 is formed in the HPW 610 region to allow a ground voltage or other voltage to be applied to the HPW 610. An implant region (not illustrated) for preventing channel stop may be formed at a lower portion of the device isolation region 602 between the LV device 100 and the HV device.

As illustrated in FIG. 13, the first transistor 100 includes a first P-type well region 720 formed in a substrate 10; a first gate insulating film 762 formed on the first P-type well region; a first gate electrode 756 formed on the first gate insulating film 762; a first spacer 754 respectively formed on sidewalls of the first gate electrode 756; a first source region 742 and a first drain region 744 formed in the first P-type well region 720; a well region 722 of which the first well region is formed under the first gate electrode 756 and having a first depth; and a first well region 720 having a second depth deeper than the first depth, and formed outside the first gate electrode 756. The second depth is greater than the depth of the device isolation regions 602, 702, and 802.

The second transistor HV 200 is formed on the substrate 10 and includes the first and second drift region 620 formed spaced apart from each other; a second gate insulating film 652 formed on the first and second drift regions; a second gate electrode 656 formed on the second gate insulating film; a second spacer 654 formed on the sidewall of the second gate electrode; and a second source region 624 and a drain region 626 respectively formed in the first and second drift regions. Each of the first and second drift regions 620 includes a shallow drift region 622 formed under the second gate electrode and having a third depth; and a deep drift region 620 having a fourth depth deeper than the third depth and formed outside the second gate electrode. The fourth depth is smaller than the depth of the device isolation regions 602, 702, and 802. The depth of the shallow drift region 622 may be greater than that of the second source 624 and the drain region 626. The second transistor has a symmetrical structure. That is, the source and drain regions may be interchangeable. The length of the gate electrode 656 of the HV device 200 is greater than the length of the gate electrode 756 of the LV device 100 because it operates at a high voltage. However, the thickness of the gate electrode 656 of the HV device 200 is formed to be similar to the thickness of the gate electrode 756 of the LV device 100. The thickness of the gate insulating film 652 of the HV device 200 is greater than that of the gate insulating film 762 of the LV device 100 because it operates at a high voltage.

The third transistor nEDMOS 300 is formed on the substrate 10, and includes a P-type deep body region 820 and N-type third drift regions 830 and 831 having different conductivity types; third and fourth gate insulating films 301a and 301b having different thicknesses from each other on the body region and the third drift region; a third gate electrode 856 on the third and fourth gate insulating films. The depth of the body region 820 or the P-type deep body region 820 is greater than that of the device isolation regions 602, 702, and 802, and the depth of the third drift regions 831, 830 is less than the depth of the device isolation region. And the third transistor nEDMOS 300 further includes third source and drain regions 824 and 826 respectively formed in the body region and the third drift region, a body contact region 822 formed in the body region 820. An inflection point exists between the shallow drift region 831 and the deep drift region 830 described above.

More particularly, the nEDMOS device 300 of FIG. 13 includes a substrate 10 including device isolation regions 602, 802, a first active region and a second active region, gate insulating films 851 and 852 including third and fourth gate insulating films 851 and 852 having different thicknesses on the substrate; a gate electrode 856 formed on the gate insulating films 851 and 852; a first conductivity type body region 820 or P-type deep body region 820 formed in the first active region and under the gate electrode; drift regions 830 and 831 of a second conductivity type in the second active region and under the gate electrode; a spacer 854 formed on the sidewall of the gate electrode; a second conductivity type source region 824 formed in the first conductivity type body region; a drain region 826 of the second conductivity type formed in the drift region of the second conductivity type; a first conductivity type body contact region 822 formed in the first conductivity type body region; a non-sal region 860 formed in the first and second active regions; silicide layer 835 and 858 formed on the source, drain and body regions and the gate electrode. The depth of the first conductivity type body region 820 is greater than the depth of the device isolation region, and the depth of the second conductivity type drift region 830 is smaller than the depth of the device isolation regions 602, 702, and 802.

The thickness of the gate electrode 856 of the nEDMOS device 300 is formed to be similar to the thickness of the gate electrode 656 of the HV device 200 and the gate electrode 756 of the LV device 100. The thickness of the thin gate insulating film 851 of the nEDMOS device 300 is identical to the thickness of the gate insulating film 762 of the LV device 100. The thickness of the thick gate insulating film 852 of the nEDMOS device 300 is the same as the thickness of the gate insulating film 652 of the HV device 200.

In the nEDMOS device 300, the first conductivity type (P-type) shallow body region 821 and the second conductivity type shallow drift region 831 are in contact with each other at a lower portion of the gate insulating film to form a PN junction region. The first conductivity type body region includes a shallow well region 821 formed under the first gate insulating film and having a first depth; and the first conductivity type body region further comprises a P-type deep body region 820 formed under the source region and having a second depth deeper than the first depth. The second conductivity type drift region includes a shallow drift region 831 formed under the second gate insulating film and having a third depth; and the second conductivity type drift region further includes a deep drift region 830 formed under the drain region and having a fourth depth deeper than the third depth. That is, the drift region of the second conductivity type includes a shallow drift region 831 and a deep drift region 830, and an inflection point exists between the shallow drift region and the deep drift region. In the semiconductor device of the present disclosure, the length of the silicide layer 835 formed in the drain region 826 is formed smaller than the length of the drain region 826.

And silicide blocking insulation layers 660 and 860 are formed on the substrate. All are deposited at the same thickness under the same condition at the same time with one film. First insulating layers 670, 770, and 870 are simultaneously formed on the silicide blocking insulation layers 660 and 860 with the same thickness under the same conditions. And interlayer insulating films 880 and 882 are formed. A plurality of contact plugs 642, 752, and 840 are formed, which are connected to the source, drain, body contact, and gate electrode. Metal wiring patterns 690, 790 and 890 connected to the respective contact plug are formed.

According to the semiconductor device manufacturing method of the present disclosure, as described above, the process is improved to form a gate pattern on the semiconductor substrate first and then perform a drift process. This improved process allows the portion under the gate edge to be formed at a smaller depth than the drift region of the source and drain regions.

As such, the shallow junction of the gate edge portion may improve the short channel effect characteristic, thereby enabling shrink down of the semiconductor device.

As a result, it is possible to reduce the size of the high-voltage semiconductor device occupying most of the display drive IC such that it is possible to manufacture a smaller IC chip, which is expected to have a competitive advantage.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a first drift region and a second drift region formed to be spaced apart from each other in a substrate;
a first gate insulating film formed on the first and second drift regions;
a first gate electrode formed on the first gate insulating film;
a first source side spacer and a first drain side spacer respectively formed on the first gate insulating film and sidewalls of the first gate electrode;
a first source region and a first drain region formed in the first and second drift regions, respectively, the first source region and the first drain region having a higher dopant concentration than the first and second drift regions;
a first source silicide blocking insulation layer in contact with the first gate insulating film, the first source region, the first drift region, the first source side spacer, and a first portion of an upper surface of the first gate electrode;
a first drain silicide blocking insulation layer in contact with the first gate insulating film, the first drain region, the second drift region, the first drain side spacer, and a second portion of the upper surface of the first gate electrode;
a first gate silicide layer formed between the first portion and the second portion;
a device isolation region formed adjacent to the second drift region;
a second gate electrode spaced apart from the device isolation region;
a second gate insulating film formed below the second gate electrode;
a second source region formed adjacent to the second gate electrode;
a second drain region spaced apart from the second gate electrode;
a well region formed on the substrate;
a body region formed in the well region and comprising a shallow body region and a deep body region, the shallow body region having a first body doping concentration and a first depth, the deep body region having a second body doping concentration and a second depth, the second body doping concentration is greater than the first body doping concentration, the second depth is greater than the first depth, wherein the body region surrounds the second source region and is formed deeper than the device isolation region, and wherein the body region does not extend to the second drain region and has a same conductivity type as the well region;
a third drift region surrounding the second drain region, wherein the third drift region comprises a first shallow drift portion and a first deep drift portion, the first shallow drift portion having a first drift doping concentration and a third depth, the first deep drift portion having a second drift doping concentration and a fourth depth, the second drift concentration is greater than the first drift doping concentration, the fourth depth is greater than the third depth,
wherein the first shallow drift portion having the third depth extending from the shallow body region to a side of the first deep drift portion that is vertically aligned with a sidewall of the second gate electrode,
wherein the first depth of the body region is greater than the third depth of the third drift region and the second depth of the body region is greater than the fourth depth of the third drift region;
a second source side spacer and a second drain side spacer respectively formed on sidewalls of the second gate electrode;
a second source silicide blocking insulation layer formed on the second source region, the body region, and the second source side spacer;
a second drain silicide blocking insulation layer spaced apart from the second source silicide blocking insulation layer and formed on the second drain region, the third drift region, and the second drain side spacer;
a second gate silicide layer formed between the second source silicide blocking insulation layer and the second drain silicide blocking insulation layer; and
a first insulating layer formed on the first and second gate electrodes,
wherein the first insulating layer is in direct contact with the first source silicide blocking insulation layer, the first drain silicide blocking insulation layer, the second source silicide blocking insulation layer, and the second drain silicide blocking insulation layer.

2. The semiconductor device of claim 1, wherein the first gate silicide layer has a lateral length smaller than a lateral length of the first gate electrode.

3. The semiconductor device of claim 1, further comprising:
a first source silicide layer and a first drain silicide layer respectively formed on the first source region and the first drain region,
wherein the first source silicide layer has a lateral length smaller than a lateral length of the first source region, and
wherein the first drain silicide layer has a lateral length smaller than a lateral length of the first drain region.

4. The semiconductor device of claim 3,
wherein the first insulating layer is in contact with the first source silicide layer and the first drain silicide layer, and
wherein the first insulating layer is formed of a silicon nitride film (SiN) or a silicon oxynitride film (SiON).

5. The semiconductor device of claim 1,
wherein each of the first and second drift regions comprises a second shallow drift region having the first drift doping concentration and the third depth, and a second deep drift region having the second drift doping concentration and the fourth depth,
wherein the second shallow drift regions are provided below the first gate electrode by dopant ions implanted into the substrate through both ends of the first gate electrode, and
wherein the second deep drift regions are provided adjacent to the respective second shallow drift regions by dopant ions implanted directly into the substrate, and extend from the respective second shallow drift region to either the first source region or the first drain region, respectively.

6. The semiconductor device of claim 1, further comprising:
a second insulating layer and a third insulating layer disposed sequentially on the first insulating layer, wherein the second insulating layer is formed on the substrate and has a greater thickness than the third insulating layer formed on the first source region; and a metal wiring layer formed on the third insulating layer, wherein the second insulating layer comprises a borophosphosilicate glass (BPSG) or a phosphosilicate glass (PSG) layer, and the third insulating layer comprises a silicon oxide layer obtained from Tetraethyl orthosilicate (TEOS) layer.

7. The semiconductor device of claim 1, the second gate insulating film comprises a thin gate oxide and a thick gate oxide, and wherein the body region and the third drift region overlap the thin gate oxide and the thick gate oxide, respectively.

8. The semiconductor device of claim 7, wherein the thick gate oxide of the second gate insulating film has a same thickness as the first gate insulating film.

9. The semiconductor device of claim 1, further comprising:

a second source silicide layer and a second drain silicide layer formed on the second source region and the second drain region, respectively, wherein each of the second source silicide blocking insulation layer and the second drain silicide blocking insulation layer extends to an upper surface of the second gate electrode.

10. The semiconductor device of claim 1, wherein the second drain silicide blocking insulation layer in contact with the third drift region has a lateral length greater than a lateral length of the second source silicide blocking insulation layer in contact with the second source region.

11. The semiconductor device of claim 1, wherein the second gate silicide layer has a lateral length smaller than a lateral length of the second gate electrode.

12. The semiconductor device of claim 1, wherein the second source silicide blocking insulation layer overlaps with the body region, and the second drain silicide blocking insulation layer overlaps with the third drift region, and are in direct contact with the second gate insulating film.

13. A semiconductor device, comprising:

a first drift region and a second drift region in a substrate;

a first gate insulating film formed on the first and second drift regions;

a first gate electrode formed on the first gate insulating film, the first gate electrode comprising a first upper portion, a second upper portion, and a center portion between the first upper portion and the second upper portion;

a first source side spacer and a first drain side spacer respectively formed on the first gate insulating film and sidewalls of the first gate electrode;

a first source region and a first drain region formed in the first and second drift regions, respectively, wherein the first source region and the first drain region have a higher dopant concentration than the first and second drift regions, respectively;

a first source silicide layer and a first drain silicide layer respectively formed on the first source region and the first drain region;

a first gate silicide layer formed on the center portion of the first gate electrode;

a first source silicide blocking insulation layer in contact with the first gate insulating film, the first source region, the first drift region, the first source side spacer, and the first upper portion of the first gate electrode;

a first drain silicide blocking insulation layer in contact with the first gate insulating film, the first drain region, the second drift region, the first drain side spacer, and the second upper portion of the first gate electrode;

a device isolation region formed adjacent to the second drift region;

a second gate electrode spaced apart from the device isolation region;

a second gate insulating film disposed below the second gate electrode;

a second source region formed adjacent to the second gate electrode;

a second drain region spaced apart from the second gate electrode;

a well region formed on the substrate;

a body region formed in the well region and comprising a shallow body region and a deep body region, the shallow body region having a first body doping concentration and a first depth, the a deep body region having a second body doping concentration and a second depth, the second body doping concentration is greater than the first body doping concentration, the second depth which is greater than the first depth, wherein the body region surrounds the source region and is formed deeper than the device isolation region, and wherein the body region does not extend to the second drain region and has a same conductivity type as the well region;

a third drift region surrounding the second drain region, wherein the third drift region comprises a first shallow drift portion and a first deep drift portion, the first shallow drift portion having a first drift doping concentration and a third depth, the first deep drift portion having a second drift doping concentration and a fourth depth, the second drift concentration is greater than the first drift doping concentration, the fourth depth is greater than the third depth, wherein the first shallow drift portion having the third depth extending from the shallow body region to a side of the first deep drift portion that is vertically aligned with a sidewall of the second gate electrode, wherein the first depth of the body region is greater than the third depth of the third drift region and the second depth of the body region is greater than the fourth depth of the third drift region;

a second source side spacer and a second drain side spacer respectively formed on sidewalls of the second gate electrode;

a second source silicide blocking insulation layer formed on the second source region, the body region, and the second source side spacer;

a second drain silicide blocking insulation layer spaced apart from the second source silicide blocking insulation layer and formed on the second drain region, the third drift region, and the second drain side spacer;

a second gate silicide layer formed between the second source silicide blocking insulation layer and the second drain silicide blocking insulation layer; and a first insulating layer formed on the first and second gate electrodes, wherein the first insulating layer is in direct contact with the first source silicide blocking insulation layer, the first drain silicide blocking insulation layer, the second source silicide blocking insulation layer, and the second drain silicide blocking insulation layer.

14. The semiconductor device of claim 13, wherein each of the first and second drift regions comprises a second shallow drift region having the first drift doping concentration and the third depth, and a second deep drift region having the second drift doping concentration and the fourth depth, wherein the second shallow drift regions are provided below the first gate electrode by dopant ions implanted into the substrate through both ends of the first gate electrode, and the second deep drift regions extends from the respective second shallow drift region to a heavily doped region that is either the first source region or the first drain region, and wherein the second deep drift regions are provided adjacent to the respective second shallow drift regions by dopant ions implanted directly into the substrate.

15. The semiconductor device of claim 13, wherein the second drain silicide blocking insulation layer in contact with the third drift region has a lateral length greater than a lateral length of the second source silicide blocking insulation layer in contact with the second source region.

16. The semiconductor device of claim 13,
wherein the second gate insulating film comprises a thin gate oxide and a thick gate oxide, and
wherein the body region and the third drift region overlap the thin gate oxide and the thick gate oxide, respectively.

17. The semiconductor device of claim 16, wherein the thick gate oxide of the second gate insulating film has a same thickness as the first gate insulating film.

18. The semiconductor device of claim 13, wherein the second source silicide blocking insulation layer overlaps with the body region, and the second drain silicide blocking insulation layer overlaps with the third drift region, and are in direct contact with the second gate insulating film.

\* \* \* \* \*